(12) United States Patent
Toh et al.

(10) Patent No.: US 9,054,191 B2
(45) Date of Patent: Jun. 9, 2015

(54) HIGH ION AND LOW SUB-THRESHOLD SWING TUNNELING TRANSISTOR

(71) Applicant: GLOBALFOUNDRIES Singapore Pte. Ltd., Singapore (SG)

(72) Inventors: Eng Huat Toh, Singapore (SG); Shyue Seng Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 55 days.

(21) Appl. No.: 14/055,893

(22) Filed: Oct. 17, 2013

(65) Prior Publication Data

US 2015/0108432 A1  Apr. 23, 2015

(51) Int. Cl.
| | |
|---|---|
| *H01L 29/06* | (2006.01) |
| *H01L 21/8238* | (2006.01) |
| *H01L 29/78* | (2006.01) |
| *H01L 29/66* | (2006.01) |
| *H01L 29/40* | (2006.01) |
| *H01L 21/8234* | (2006.01) |

(52) U.S. Cl.
CPC ........ *H01L 29/785* (2013.01); *H01L 29/66795* (2013.01); *H01L 29/408* (2013.01); *H01L 21/823456* (2013.01)

(58) Field of Classification Search
CPC .............. H01L 21/823456; H01L 29/785; H01L 29/66795; H01L 29/408
USPC ............................................ 257/29; 438/222
See application file for complete search history.

(56) References Cited

U.S. PATENT DOCUMENTS

| | | | | |
|---|---|---|---|---|
| 8,487,378 | B2 * | 7/2013 | Goto et al. ..................... | 257/347 |
| 2015/0024559 | A1 * | 1/2015 | Xiao et al. ..................... | 438/151 |

OTHER PUBLICATIONS

Chenming Hu et al., Green Transistor—A VDD Scaling Path for Future Low Power ICs, IEEE, 2008, 2 pages, USA.

* cited by examiner

*Primary Examiner* — David S Blum
(74) *Attorney, Agent, or Firm* — Horizon IP Pte. Ltd.

(57) ABSTRACT

Devices and manufacturing methods thereof are presented. The device includes a substrate and a fin-type transistor disposed on the substrate. The transistor includes a fin structure that protrudes from the substrate to serve as a source of the transistor. The fin structure is doped with dopants of a first polarity. The transistor also includes a gate layer formed over and around a first end of the fin structure to serve as a gate of the transistor. A drain layer is disposed over the fin structure and adjacent to the gate layer to serve as a drain of the transistor. The drain layer is doped with dopants of a second polarity opposite the first polarity.

20 Claims, 22 Drawing Sheets

HIGH ION AND LOW SUB-THRESHOLD SWING TUNNELING TRANSISTOR

BACKGROUND

The general trend in the design of semiconductor devices is packing more computing power into an ever-shrinking feature size. This, however, leads to a number of technical challenges. For example, exponentially rising power consumption leads to power supply voltage scaling. Additionally, for low-power nano-electronics which require 0.4-volt $V_{DD}$ and a ratio of drive current ($I_{ON}$) to leakage current ($I_{OFF}$) in the order of approximately $10^6$, an average swing of less than 60 mV/dec or a sub-threshold swing (SS) of much less than 60 mV/dec is required as the reduction of SS results in lower power consumption and better performance. However, the theoretical limit for complementary metal oxide (CMOS) technology is 60 mV/dec at room temperature.

Therefore, it is desirable to provide a highly scalable device with increased $I_{ON}$ and SS which is less than the theoretical limit of CMOS technology.

SUMMARY

Embodiments generally relate to semiconductor devices. In one embodiment, a device is presented. The device includes a substrate and a fin-type transistor disposed on the substrate. The transistor includes a fin structure that protrudes from the substrate. The fin structure is doped with dopants of a first polarity and serves as a source of the transistor. The transistor also includes a gate layer formed over and around a first end of the fin structure to serve as a gate of the transistor. The transistor further includes a drain layer formed over the fin structure and adjacent to the gate layer to serve as a drain of the transistor. The drain layer is doped with dopants of a second polarity opposite the first polarity.

In another embodiment, a method of manufacturing a device is disclosed. The method includes forming a fin-type transistor on a substrate. In forming the transistor, the method forms a fin structure that protrudes from the substrate and serves as a source of the transistor. The fin structure is doped with dopants of a first polarity. The method also forms a gate layer over and around a first end of the fin structure to serve as a gate of the transistor. The method further forms a drain layer over the fin structure and adjacent to the gate layer to serve as a drain of the transistor. The drain layer is doped with dopants of a second polarity opposite the first polarity.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following.

DETAILED DESCRIPTION

Embodiments of the present disclosure generally relate to devices, such as semiconductor devices or integrated circuits (ICs). More particularly, some embodiments relate to transistors employed to form ICs. The transistors, for example, include tunneling transistors. The ICs can be any type of IC. For example, the IC may be a dynamic or static random access memory, a signal processor, or a system on chip (SoC) device. The ICs can be incorporated into, for example, consumer electronic products, such as computers, cell phones, and personal digital assistants (PDAs). Other types of devices or products are also useful.

Figure 1A:
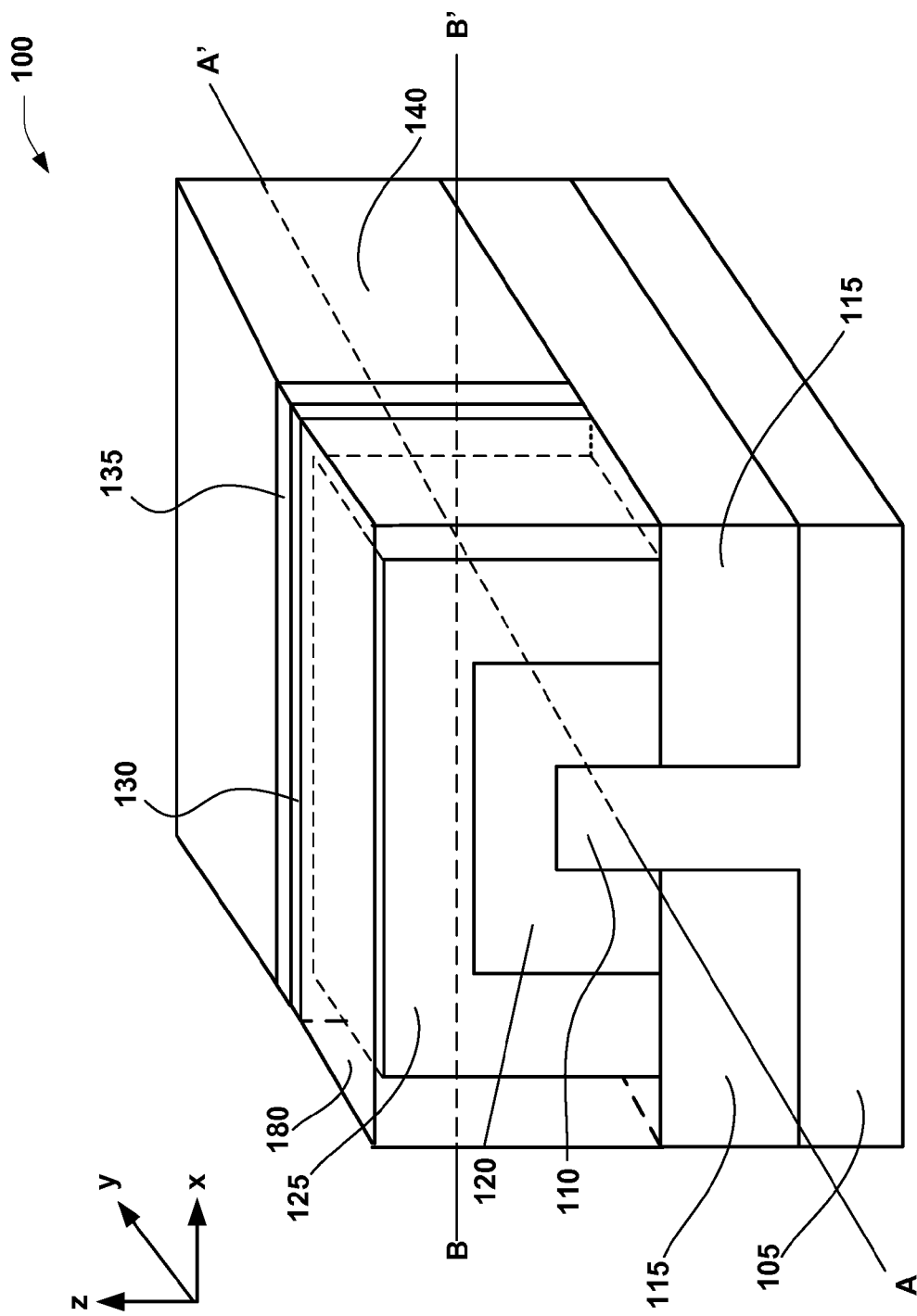
FIGS. 1a-1d show various views of an embodiment of a device.
Figure 1B:
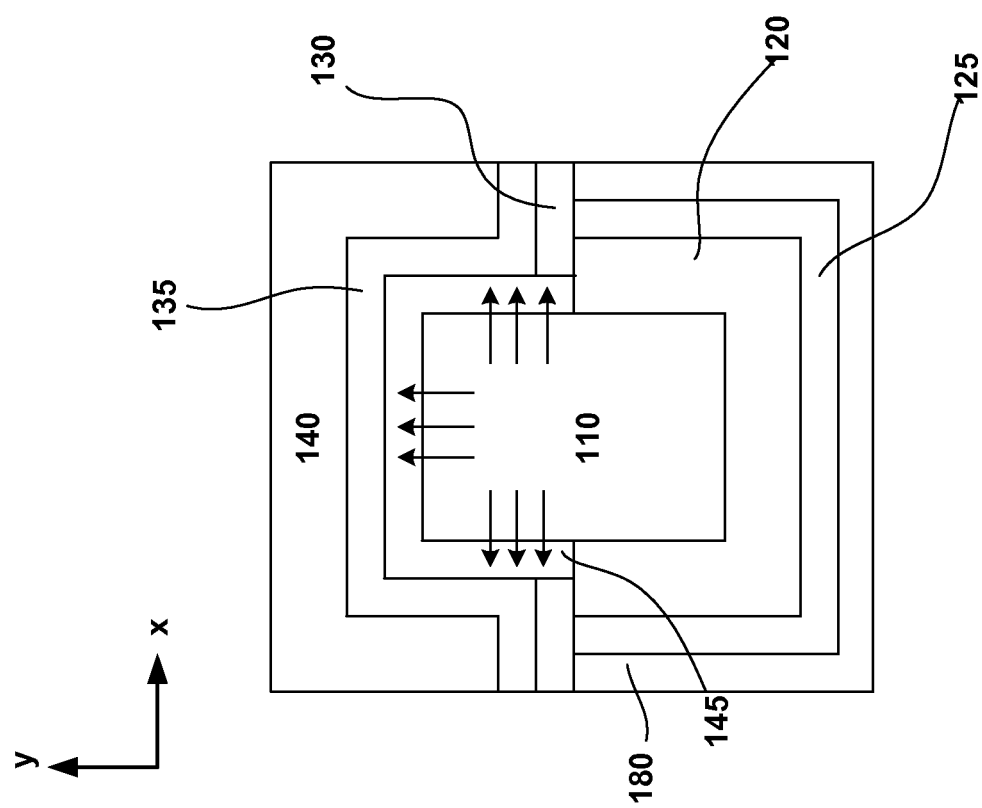
Figure 1C:
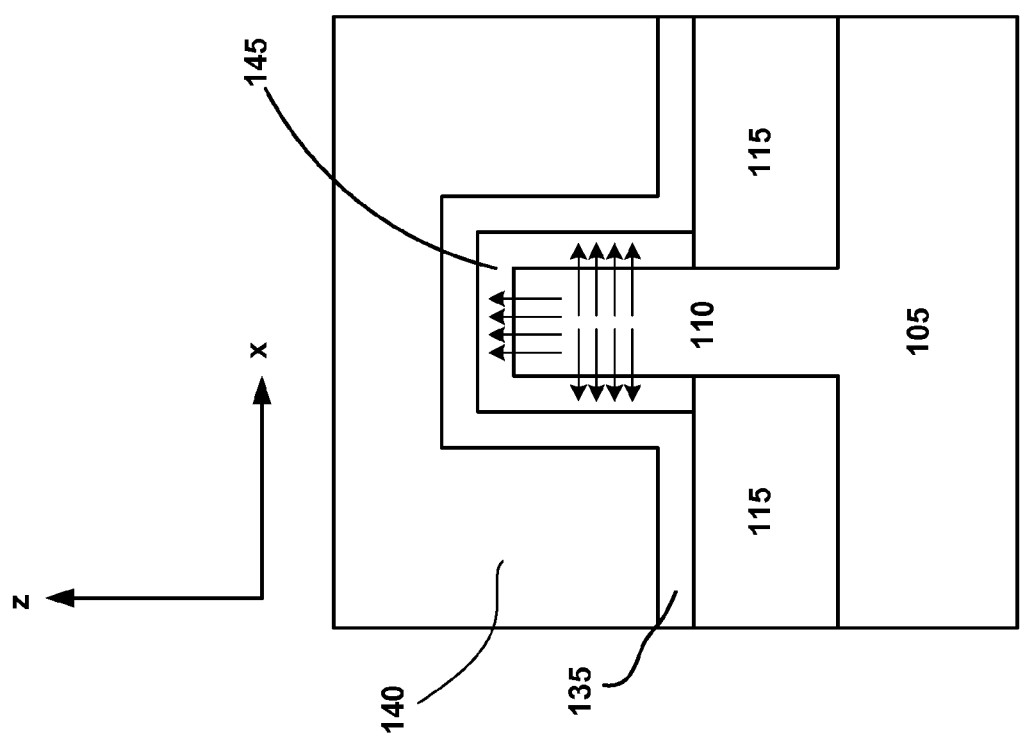
Figure 1D:
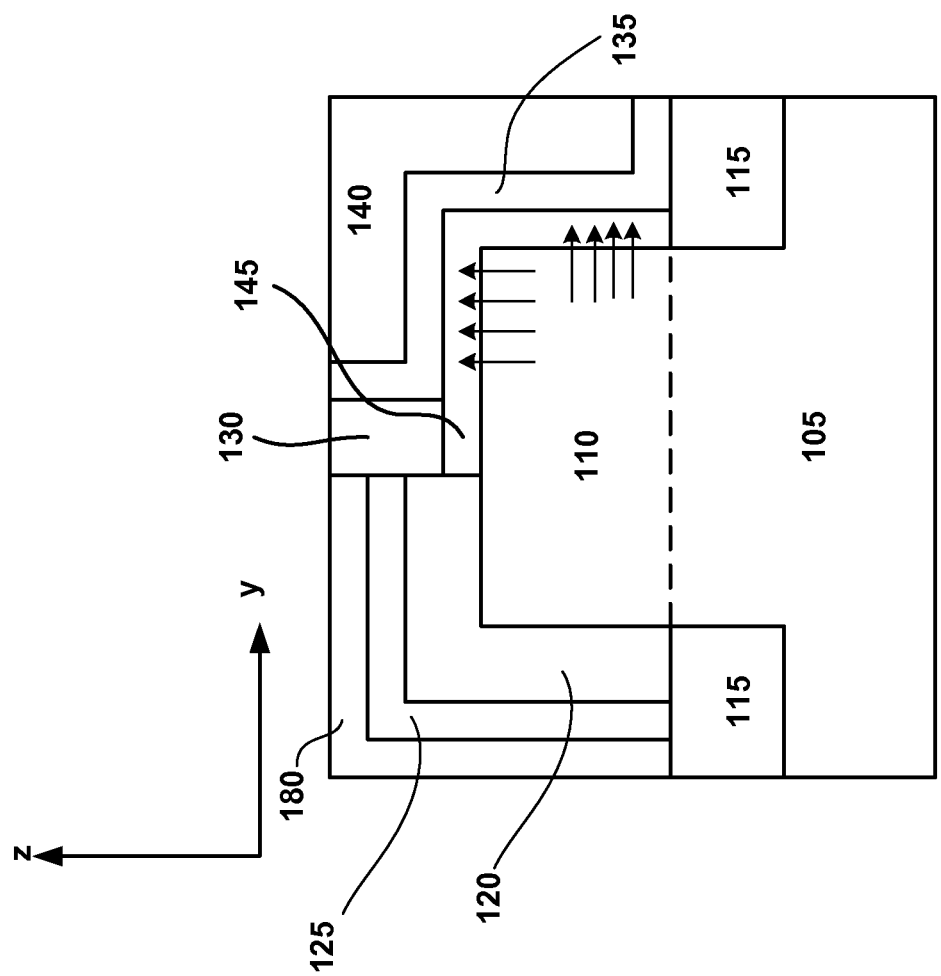

FIGS. 1a-1d show various views of an embodiment of a device 100. FIG. 1a shows a 3-dimensional view of an embodiment of the device 100. FIG. 1b shows a corresponding cross-sectional view of the device 100 along a x-y plane parallel to the substrate surface at A-A'. FIG. 1c shows a corresponding cross-sectional view of the device 100 along a x-z plane perpendicular to the substrate surface at B-B'. FIG. 1d shows a corresponding cross-sectional view of the device 100 along a y-z plane perpendicular to the substrate surface at A-A'. The device 100, for example, is an IC. Other types of devices may also be useful. The description of the device 100 below refers to FIGS. 1a-1d.

The device 100 includes a substrate 105. The substrate 105 serves as a base for the device 100. In some embodiments, the substrate 105 may be a bulk semiconductor substrate. The bulk substrate may be a silicon substrate. Other types of semiconductor substrates may be useful. The substrate 105 may be an undoped or intrinsically-doped substrate. Alternatively, the substrate 105 may be a lightly doped substrate. In one embodiment, the substrate 105 is lightly doped with p-type dopants. In other embodiments, the substrate 105 may be lightly doped with other types of dopants, such as n-type dopants.

The substrate 105 is prepared with a transistor disposed thereon. The transistor, in one embodiment, is a fin type transistor. For example, the transistor is a fin field effect transistor (FinFET). The FinFET is a tunneling FinFET. The tunneling FinFET, in one embodiment, is a vertical tunneling FinFET. Other types of fin transistors may also be useful. The tunneling FinFET, for example, is disposed in a device region on a substrate. In one embodiment, the FinFET includes a fin structure 110 protruding from a surface of the substrate 105. In other embodiments, the FinFET includes a plurality of fins or fin structures.

In one embodiment, the fin structure 110 is an elongated structure. For example, the fin structure 110 is an elongated member with a rectangular cross-sectional shape, forming a rectangular block. Providing other types of fins may also be useful. The fin structure, for example, may be an integral part of the substrate or an epitaxial fin that is formed and processed on the surface of the substrate. Other configurations of the fin may also be useful.

The fin structure 110 serves as a source of the transistor. The fin structure 110 is entirely or partially doped with dopants of a first polarity. The transistor has a gate layer 140 conformally disposed or wrapped over and around a first end of the fin structure 110 along a longitudinal axis of the fin structure 110 to serve as a gate of the transistor. The transistor also has a drain layer 125 disposed over the fin structure 110 and adjacent to the gate layer 140 to serve as a drain of the transistor. The drain layer, for example, may or may not be conformal, depending on the growth mechanism and surface, which may lead to various shapes, including diamond, hexagonal, etc. In one embodiment, as shown in FIGS. 1a-1d, the drain layer 125 is disposed over and around a second end of the fin structure 110 opposite the first end. The drain layer 125 is doped with dopants of a second polarity opposite the first polarity. In one embodiment, dopants of the first polarity are p-dopants and dopants of the second polarity are n-dopants. Alternatively, dopants of the first polarity are n-dopants and dopants of the second polarity are p-dopants. The dopant concentration for the source and drain, for example, is about 1e18-1e20 $cm^{-3}$. The drain, for example, may also include graded concentration of second polarity type dopants. Other dopant concentrations may also be useful.

As the gate layer 140 surrounds the first end of the fin structure 110, four surfaces of the fin structure 110 which are at least partially adjacent to the gate layer serve as tunneling surfaces. This design advantageously maximizes the surface area of the fin structure 110, which is the source of the transistor, for tunneling.

The device 100 may include a fin buffer layer 145 disposed on and around the first end of the fin structure 110. The fin buffer layer may include various material(s) that are configured to provide narrow Eg or Ec which is close to Ev of the source which optimize the tunneling, such as smaller band gap materials. The fin buffer layer 145, for example, may be a band gap engineered layer with pockets of dopants, corresponding to a pocket region. The fin buffer layer may include a single layer or multiple layers. For example, the fin buffer layer may be an intrinsic layer or n+ doped layer. Alternatively, the fin buffer layer may include a first intrinsic layer and a second n+ doped layer disposed thereover. The fin buffer layer, in another embodiment, may include a first p+ doped layer and a second intrinsic layer, or a first p+ doped layer with a second n+ doped layer thereover.

The device 100 may also include a gate dielectric layer 135 disposed between the fin buffer layer 145 and the gate layer 140. That is, in some embodiments, the fin buffer layer 145 and the gate dielectric layer 135 are disposed between the fin structure 110 and the gate layer 140. The device 100 may further include an intrinsically-doped layer 120, disposed between the fin structure 110 and the drain layer 125 to serve as a drain intrinsic region of the transistor, and a dielectric spacer 130, disposed between the drain layer 125 and the gate layer 140. In one embodiment, as shown in FIGS. 1a-1d, the intrinsically-doped layer 120 is conformally disposed on and around the second end of the fin structure 110. The device 100 may further include an isolation layer 115 disposed on the substrate 105 and around the fin structure 110, isolating the device from other device regions. The isolation layer, for example, includes silicon oxide. Other suitable types of materials may also be used as the isolation layer. An inter-level dielectric (ILD) layer 180 is disposed over the substrate. For example, the ILD layer 180 is disposed over the drain layer 125. The ILD layer, as shown in FIGS. 1a-1d, includes a top surface which is substantially coplanar with a top surface of the gate layer 140. The ILD, for example, may include silicon oxide. Other types of dielectric material may also be useful.

In one embodiment, the gate formed by the gate layer 140 is a high k metal gate (HKMG). The HKMG includes a high k gate dielectric layer and a metal gate electrode. The metal gate electrode, for example, includes TaN, TiN, etc. The gate dielectric layer 135, for example, may be silicon oxynitride, hafnium oxide ($HfO_2$), HfSiON, $La_2O_3$, zirconium oxide or silicates thereof. A work function tuning layer (not shown) may optionally be disposed in between the metal gate and high k gate dielectric layer. The work function tuning layer, for example, includes TiN/Al/TiN, etc. Other types of metal gate, high k dielectric and work function tuning materials may also be useful.

The transistor of the device 100 offers a number of advantages over conventional transistors. For instance, with an embedded source under the gate and a raised drain and an intrinsic region, the compact tunneling FinFET structure has a high packing density. This design provides uniform gate-controlled band-to-band tunneling with relatively larger tunneling surface area (i.e., four surfaces of the fin structure which function as the source of the transistor). This results in lower SS over a wider range as well as higher $I_{ON}$. Additionally, better performance is achievable with a fin buffer layer, for example, which may include a band gap engineered layer with pockets of dopants (e.g., pocket region) to result in high IoN and steeper SS. Moreover, current leakage is controlled with p-i-n junction and band engineered fin/drain to result in minimized leakage. Furthermore, the manufacturing process of the device 100 is compatible with complementary metal oxide semiconductor (CMOS) technology and infrastructure.

There are a number of requirements for the selection of the materials for the components of the transistor in the device 100. The requirement for the source of the transistor, which is the fin structure, is high dopant activation. The requirement for the fin buffer layer, such as the band gap engineered pocket is narrow band gap (Eg) or conduction band (Ec) close to valence band (Ev) of the source for ease of tunneling. The requirement for the drain is large Eg or adequately large Ec band alignment to channel Ev for low current leakage.

Table 1 illustrates exemplary combinations of materials for different components of the transistor, namely the source (i.e., fin structure), band gap engineered pocket (e.g., pocket region) and the drain. For example, for a given material for the source, corresponding option(s) of materials for the band gap engineered pocket and the drain are provided.

TABLE 1

| Source | Band Gap Engineered Pocket | Drain |
|---|---|---|
| Si | Si | Si |
|  | SiGe |  |
|  | Ge |  |
| SiGe | Si | Si |
|  | SiGe | SiGe |
|  | Ge |  |
|  | GeSn |  |
| Ge | Si | Si |
|  | SiGe | SiGe |
|  | Ge | Ge |
|  | GeSn | GeSn |
|  | GaAs | GaAs |
|  | InGaAs | InGaAs |
| InAs | InAs | Si |
|  |  | InAs |
| InGaAs | InGaAs | InGaAs |
| AlGaPSb | InAsP | InAsP |
|  | InGaAs | InGaAs |

TABLE 1-continued

| Source | Band Gap Engineered Pocket | Drain |
|--------|---------------------------|-------|
| GaAsSb | InAlAs<br>InGaAs<br>InP | InAlAs<br>InGaAs<br>InP |

The tunneling transistor, as described above with reference to FIGS. 1a-1d, uses band-to-band tunneling (BTBT) effect to turn on and off. The gate voltage is used to adjust the bias between the P-N junction near the gate to achieve the purpose of turning on and off the tunneling transistor. When both the n dopant and p dopant concentrations between a P-N junction are very high, the tunneling width becomes small in the depletion region. Applying a reverse bias to the P-N junction decreases the tunneling width, increasing the tunnel current crossing the P-N junction. Furthermore, the tunneling is a vertical tunneling. For example, the tunneling occurs in the direction perpendicular to the source/gate dielectric interface surfaces, shown as arrows in FIGS. 1b-1d. The vertical tunneling FinFET as described results in advantages highlighted above.

Figure 2A:
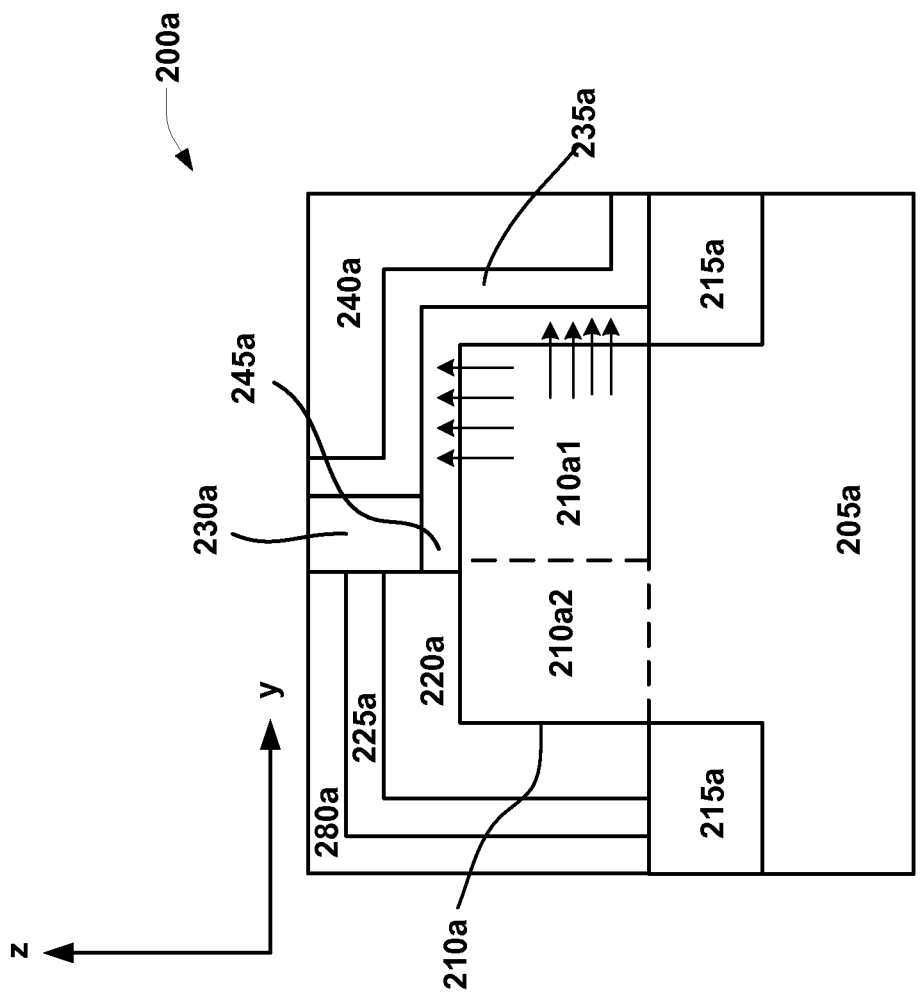
FIGS. 2a-2f show cross-sectional views of other embodiments of devices.
Figure 2B:
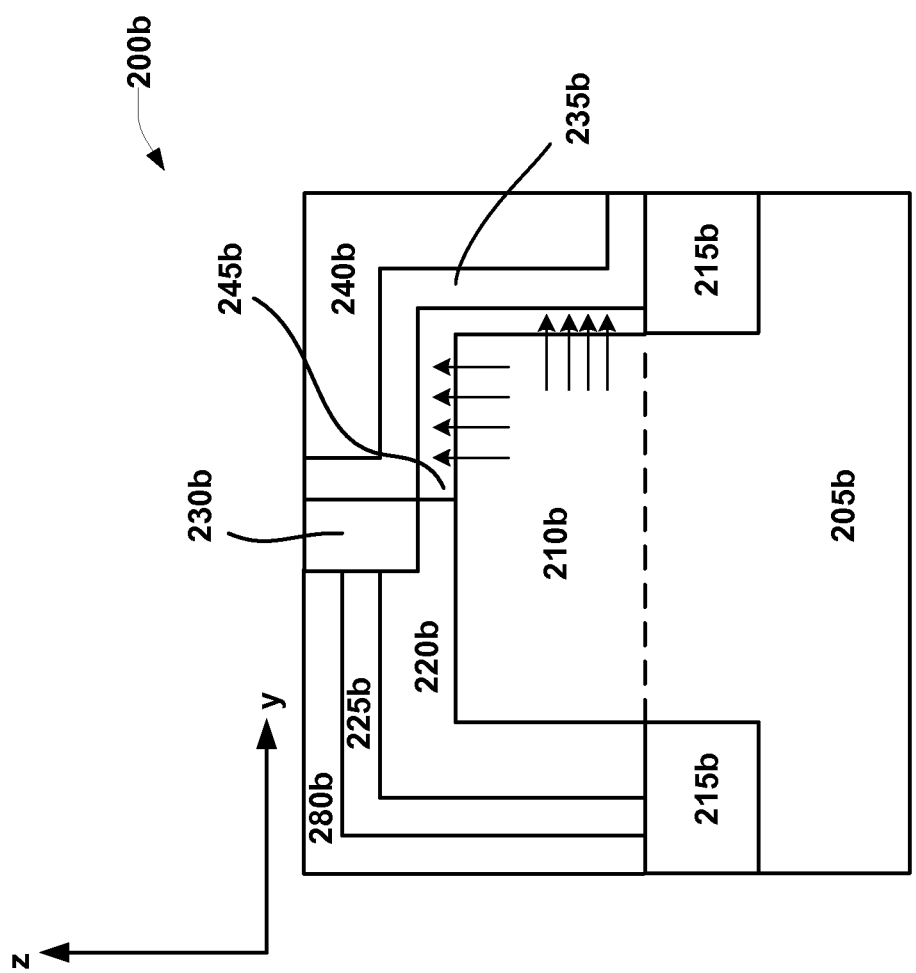
Figure 2C:
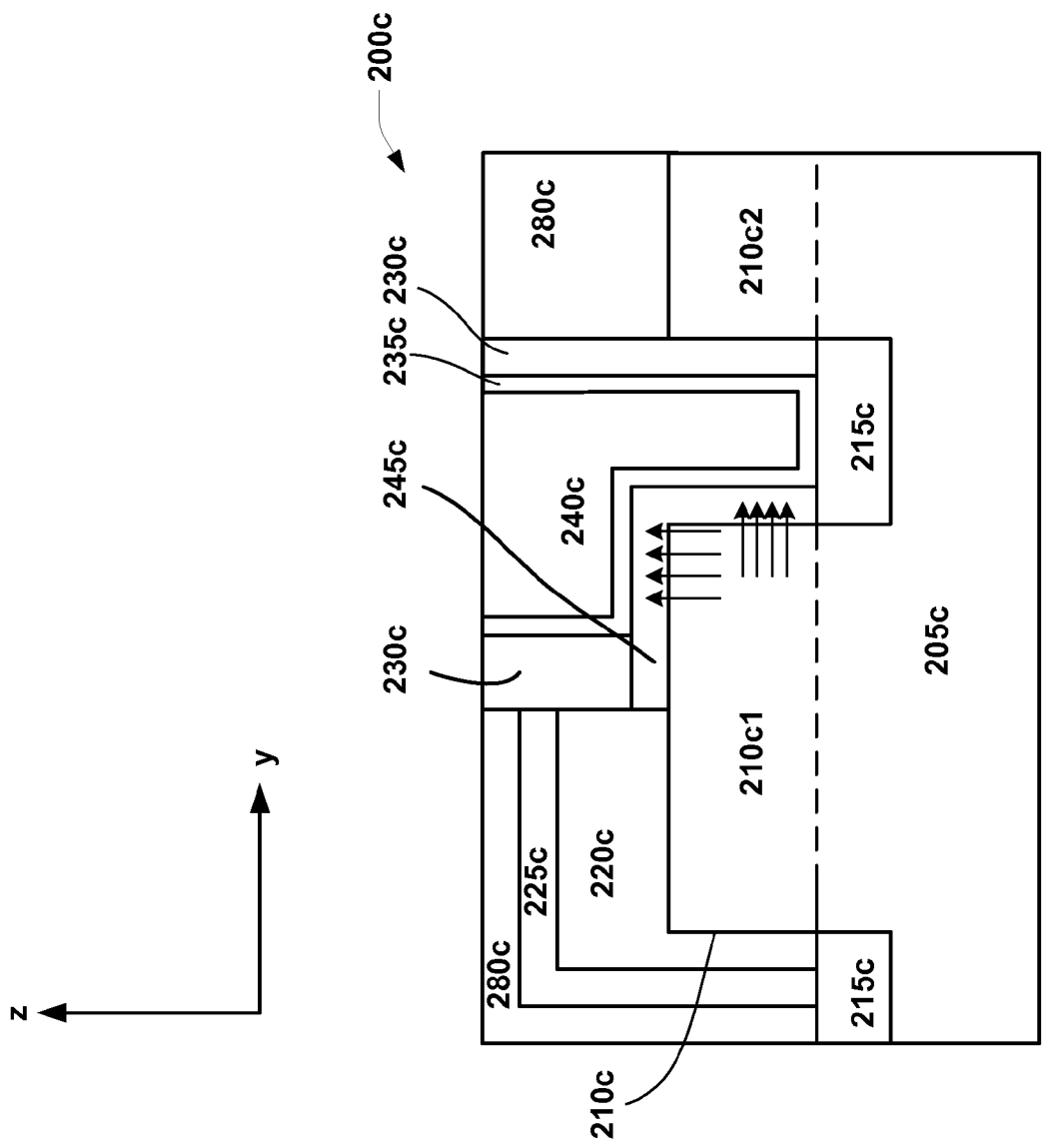
Figure 2D:
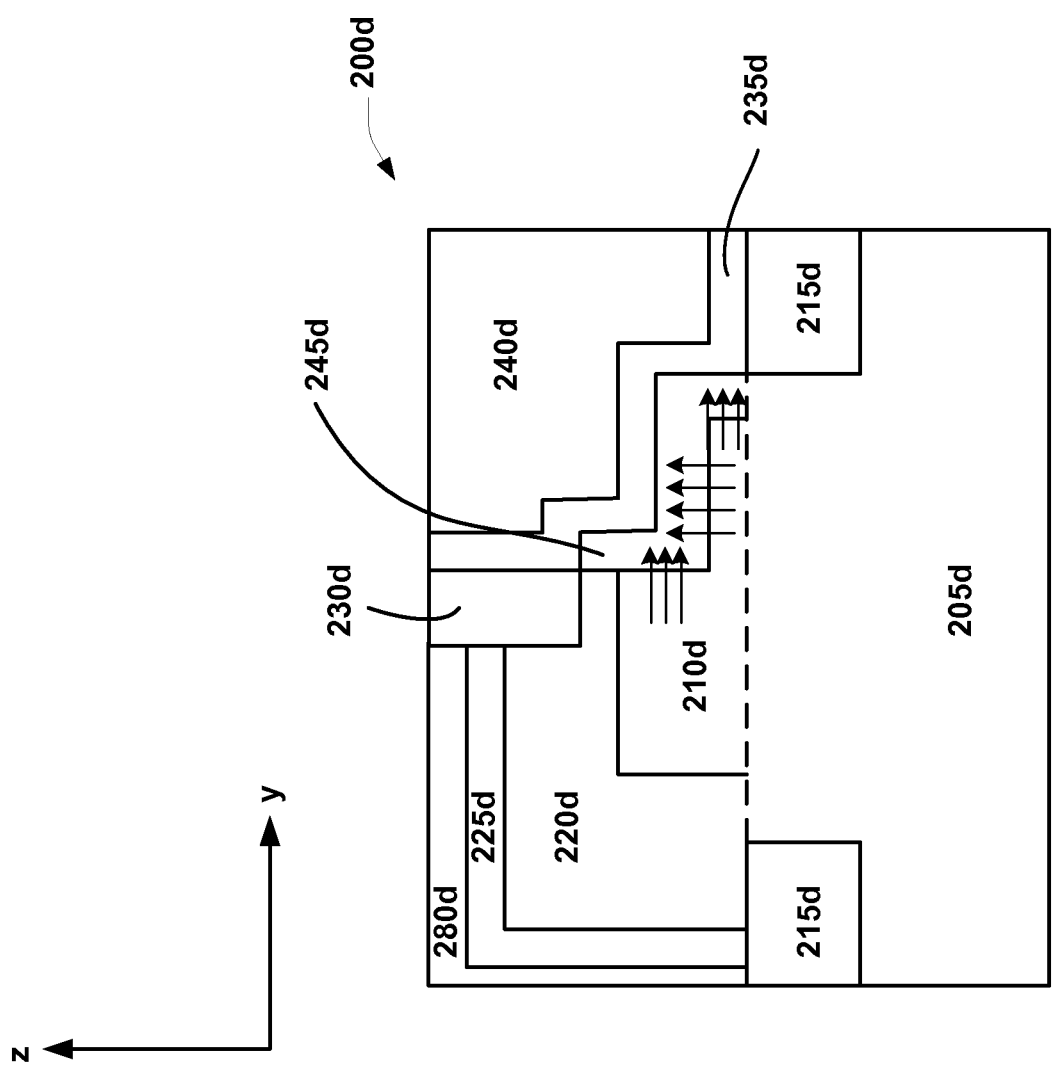
Figure 2E:
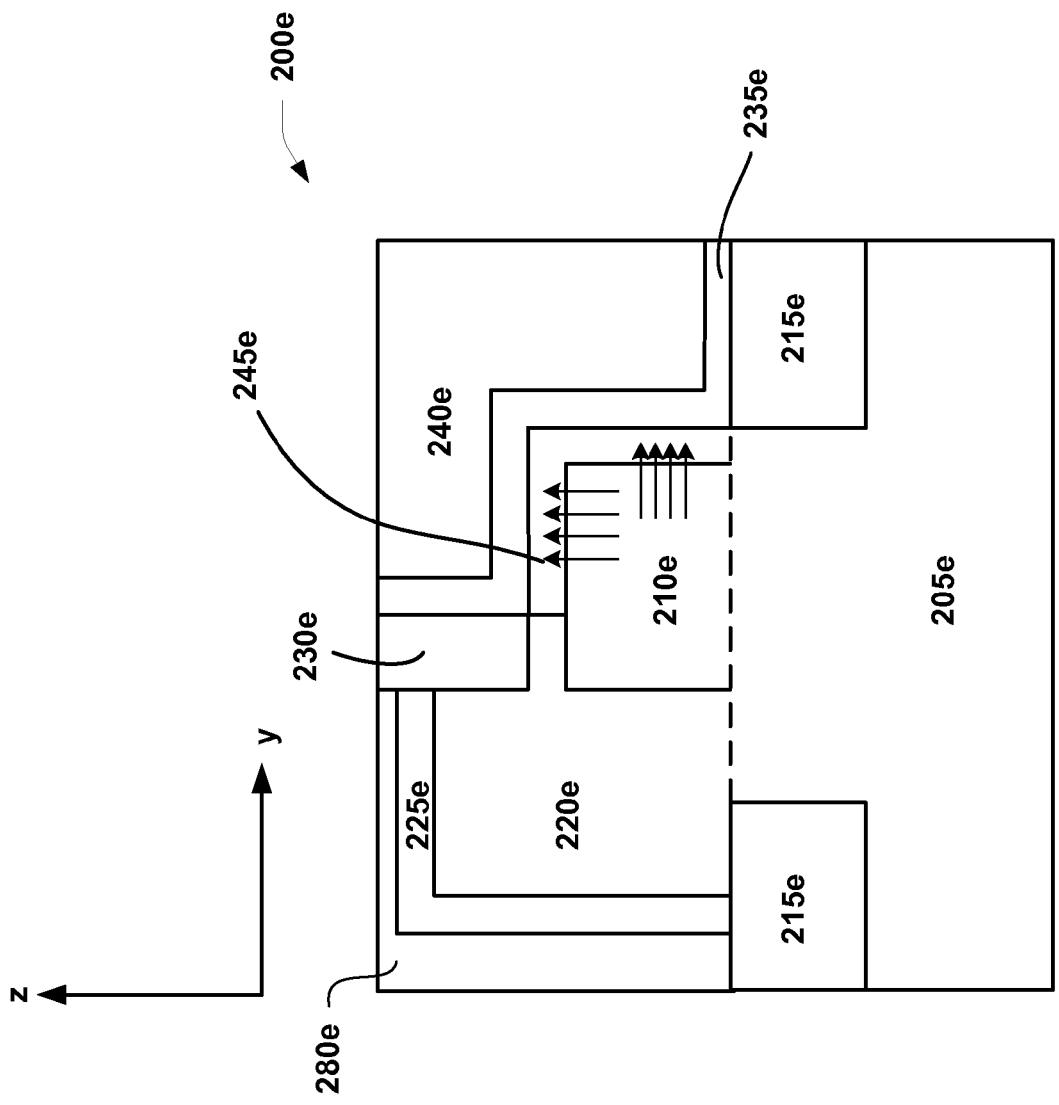
Figure 2F:
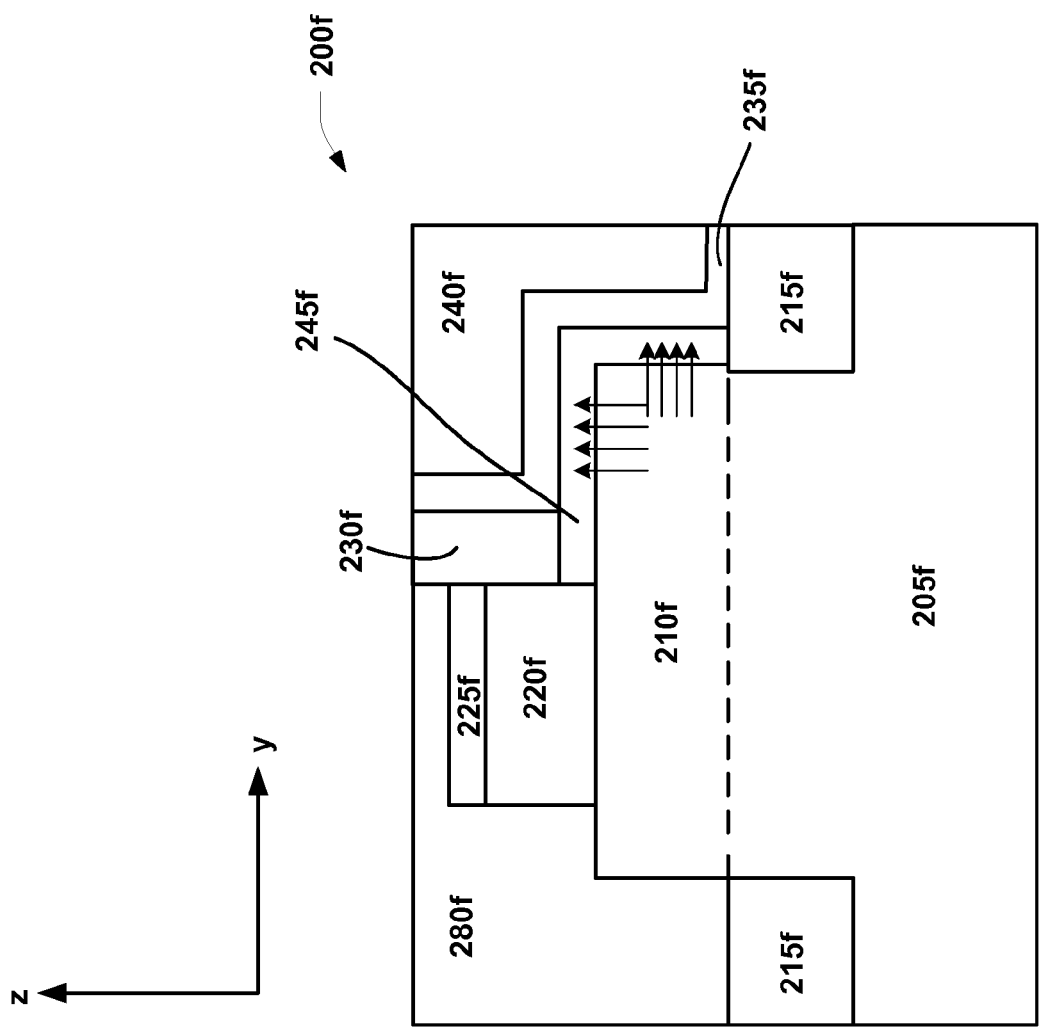
Figure 3A:
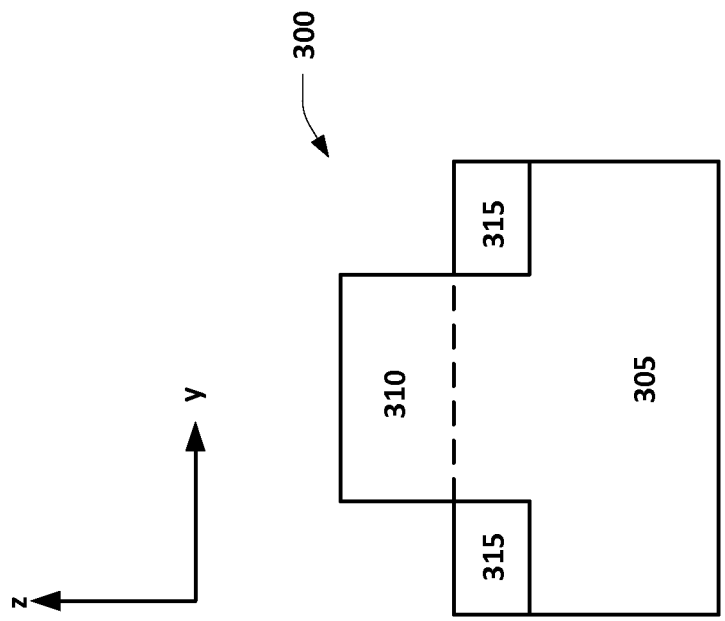
FIGS. 3a-3f show various cross-sectional views of an embodiment of a process for manufacturing a device, where figures with a subscript (1) are cross-sectional views along the x-z plane and figures with a subscript (2) are cross-sectional views along the y-z plane.
Figure 3A:
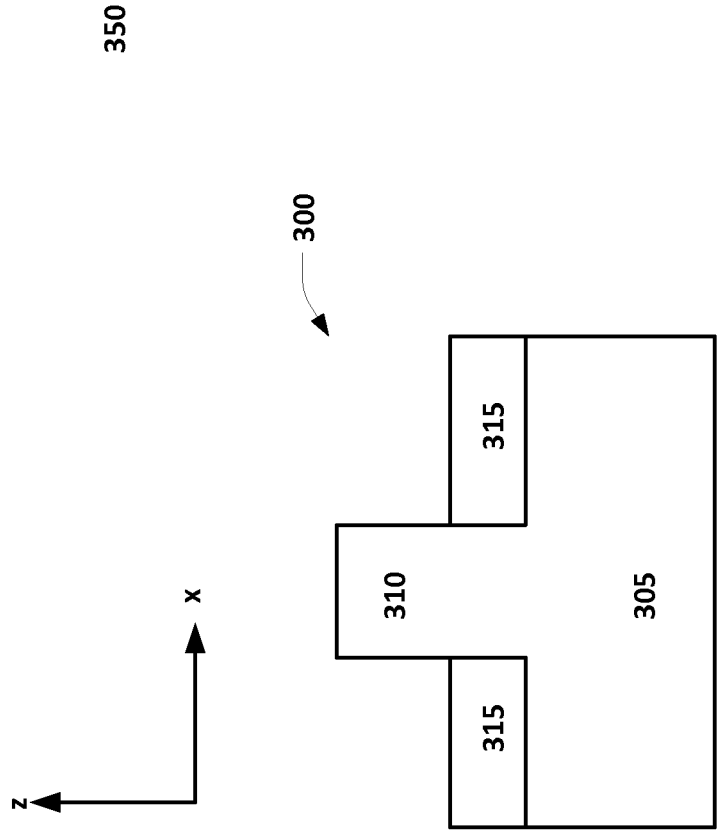
Figure 3B:
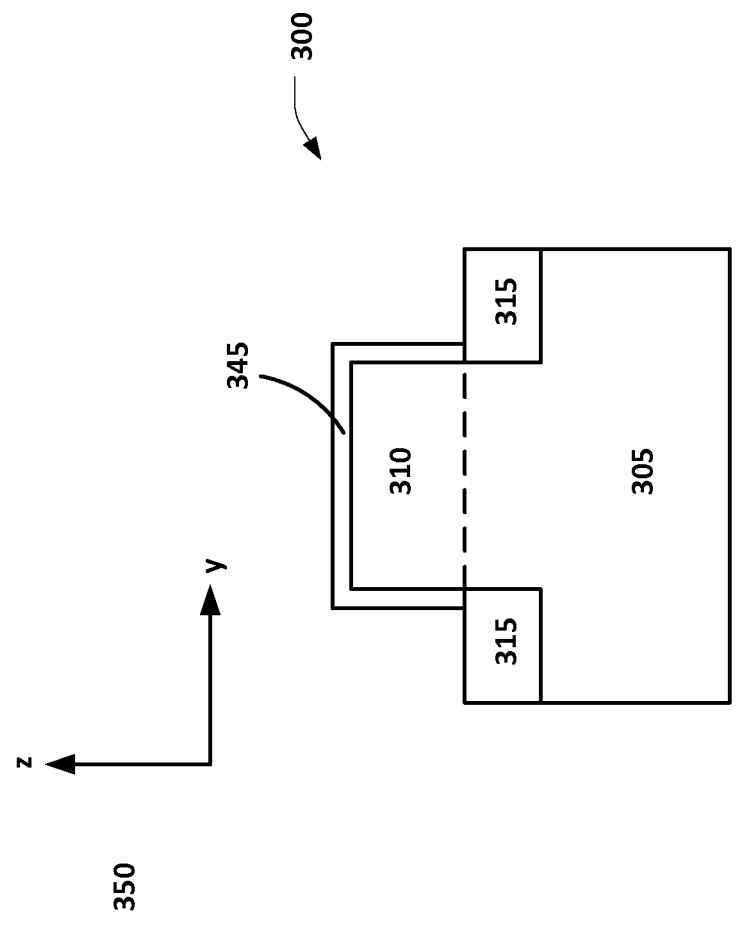
Figure 3B:
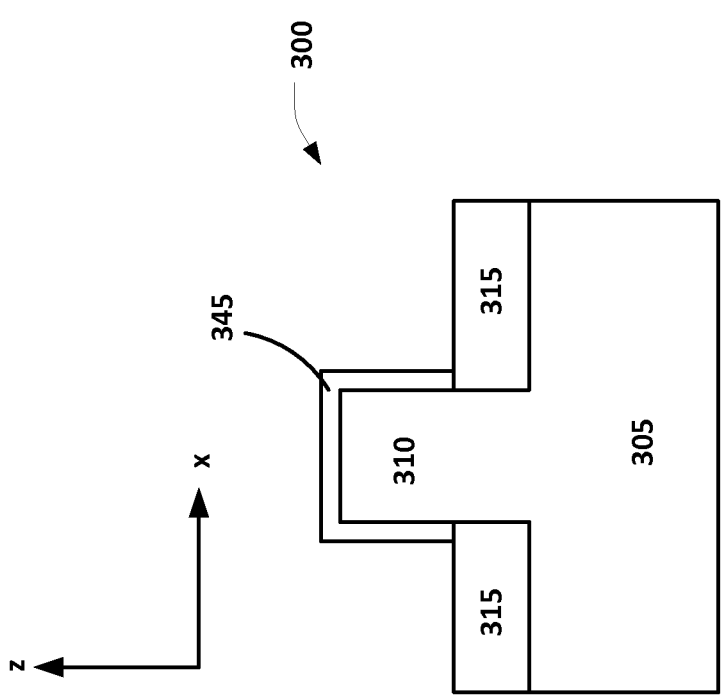
Figure 3C:
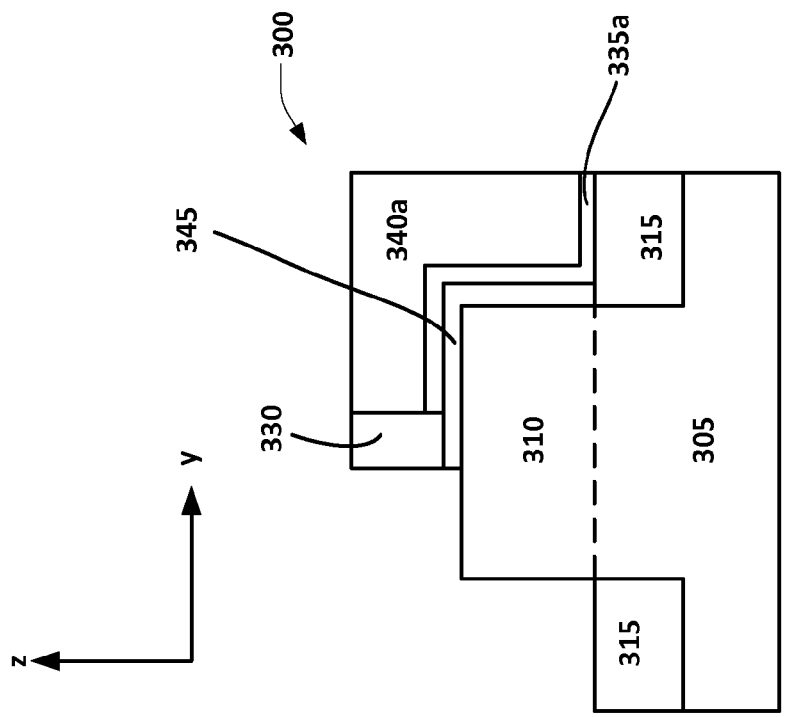
Figure 3C:
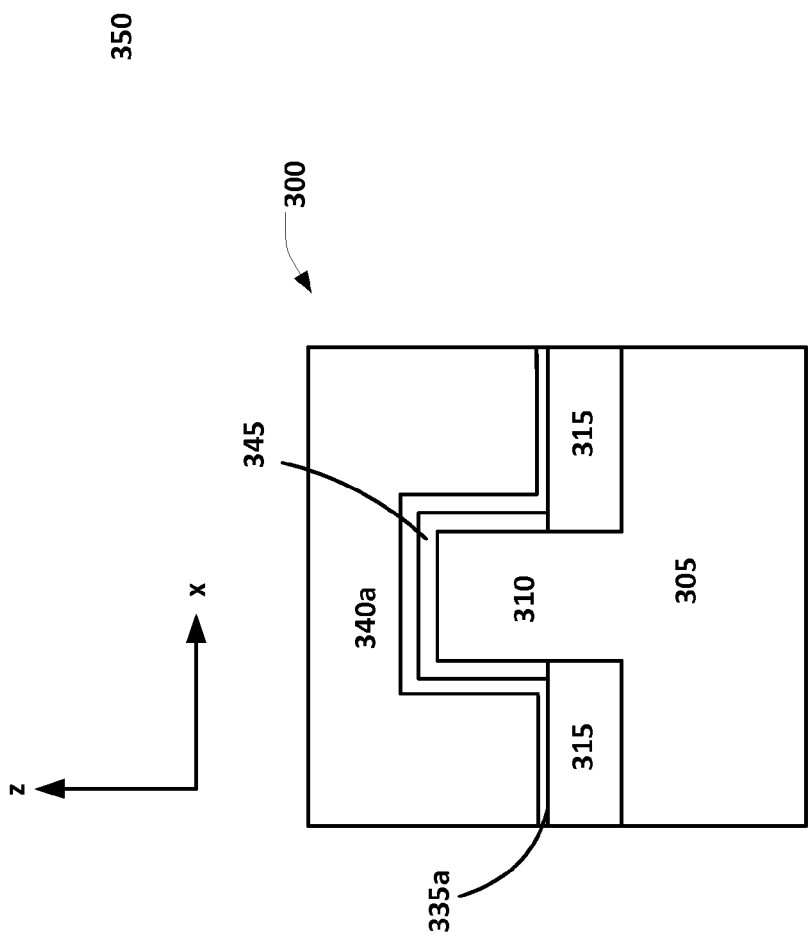
Figure 3D:
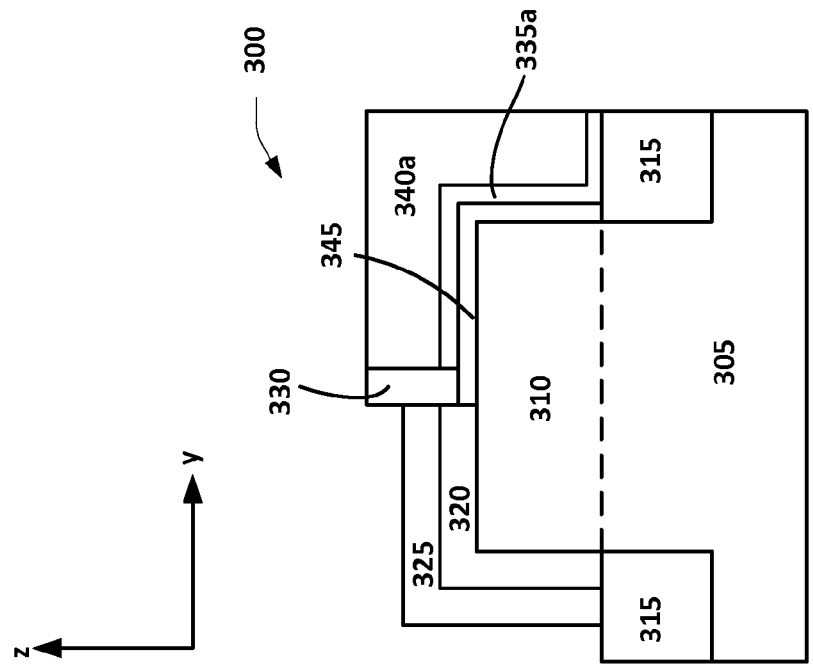
Figure 3D:
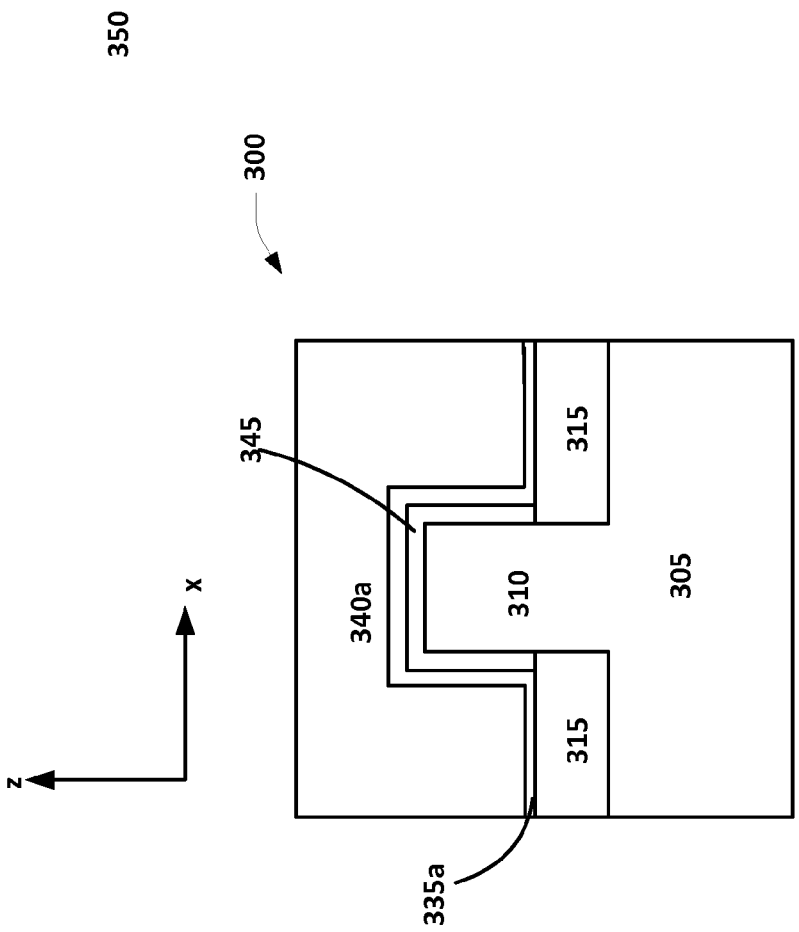
Figure 3E:
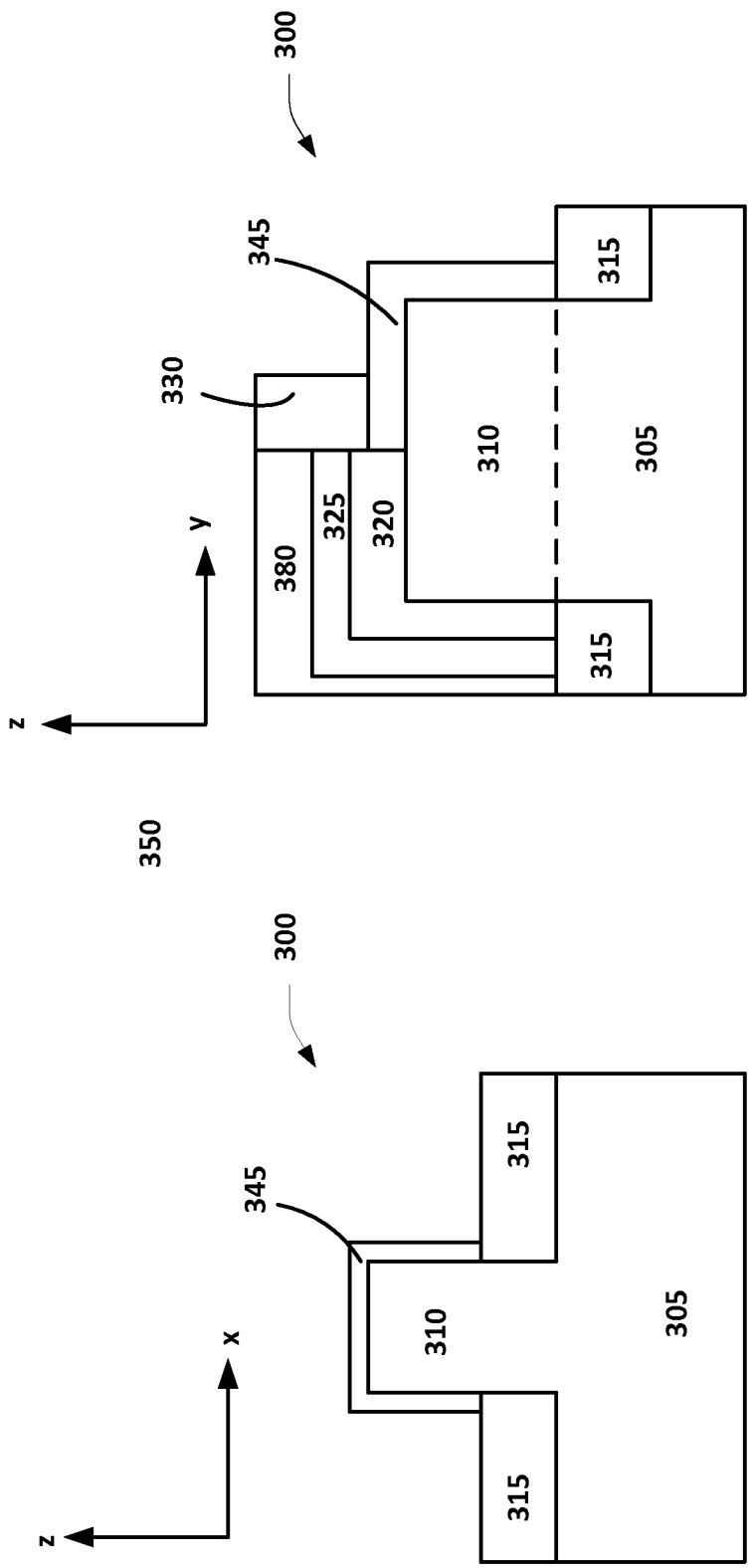
Figure 3F:
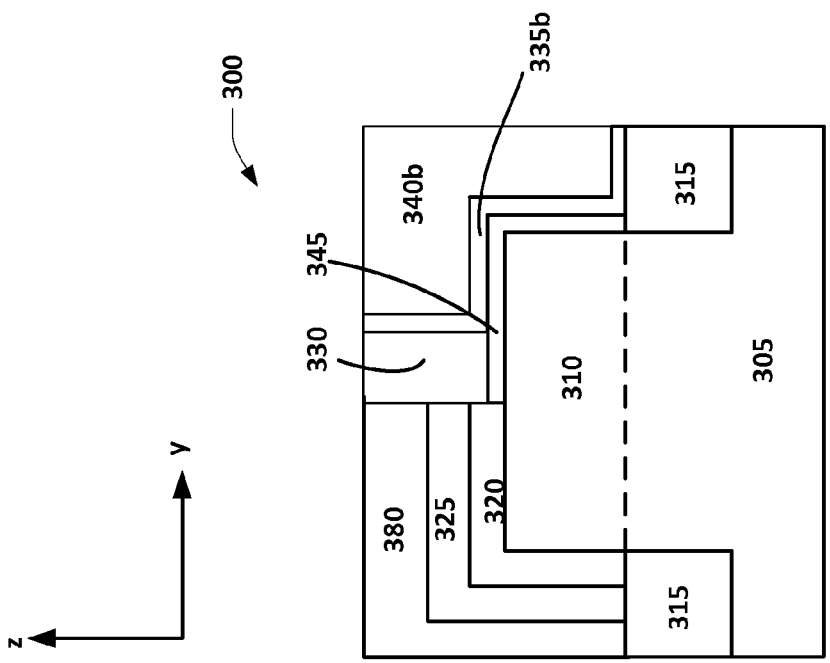
Figure 3F:
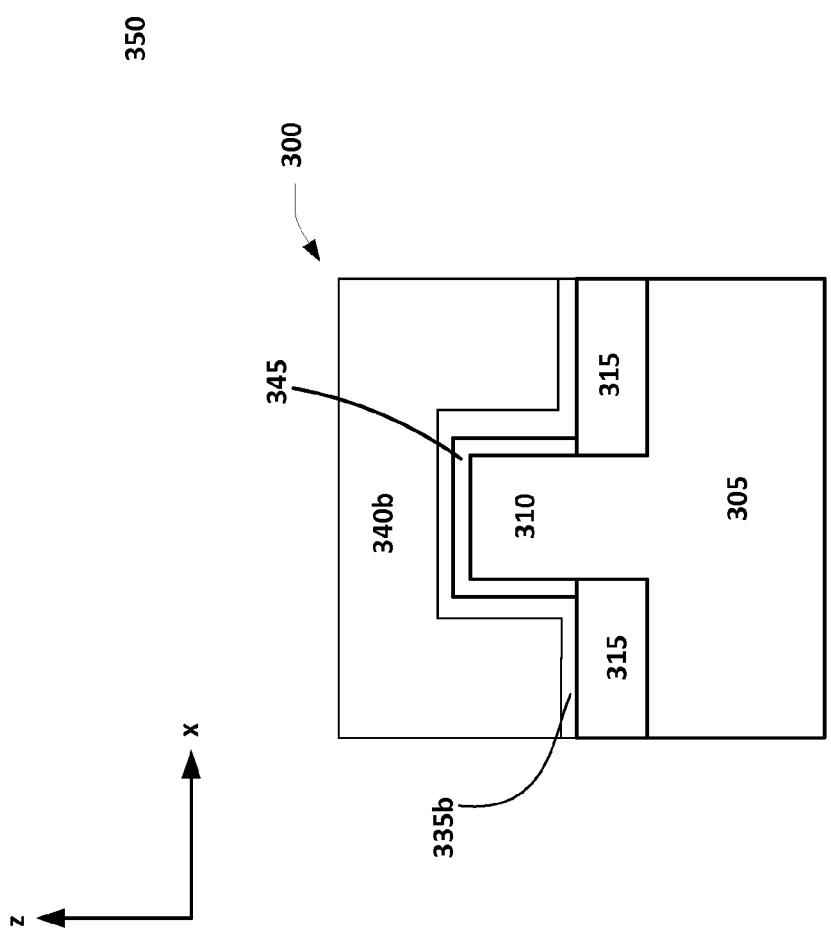
Figure 4A:
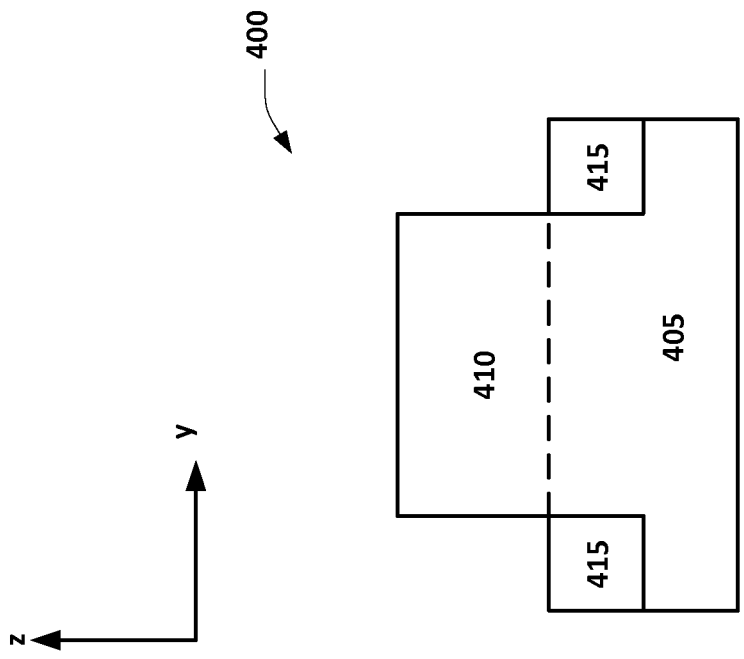
FIGS. 4a-4f show various cross-sectional views of another embodiment of a process of manufacturing a device, where figures with a subscript (1) are cross-sectional views along the x-z plane and figures with a subscript (2) are cross-sectional views along the y-z plane.
Figure 4A:
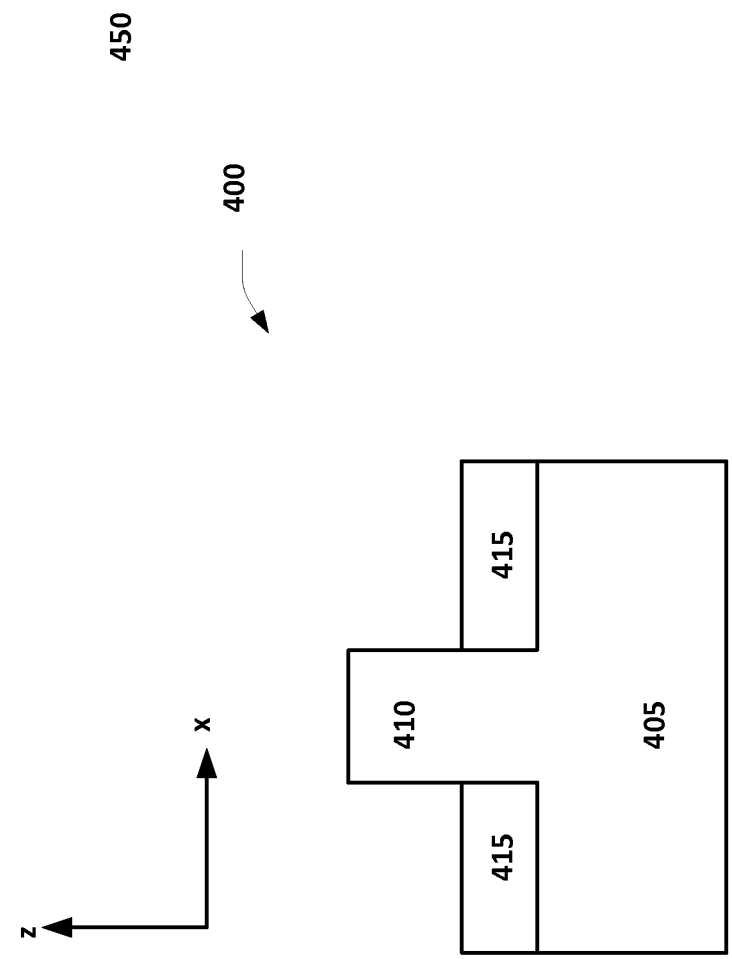
Figure 4B:
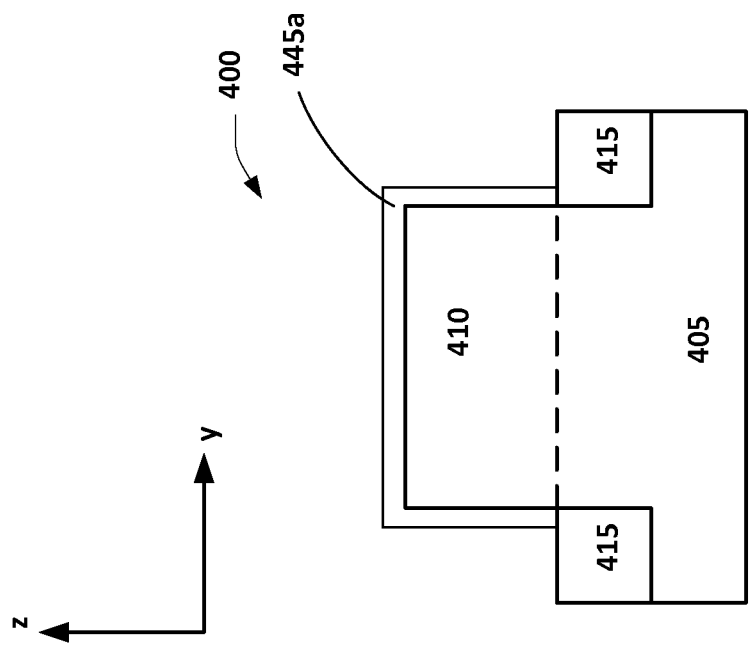
Figure 4B:
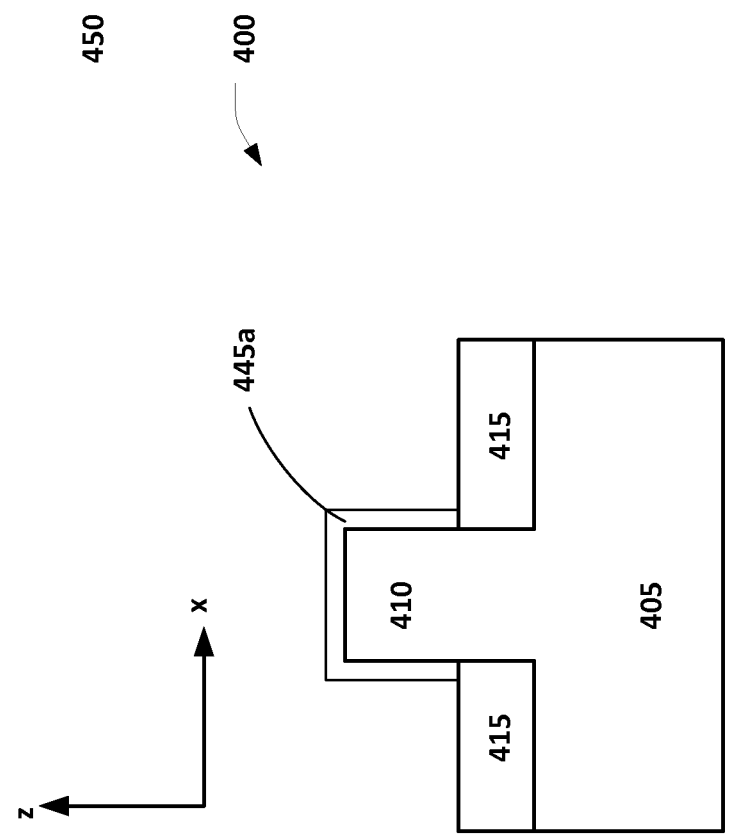
Figure 4C:
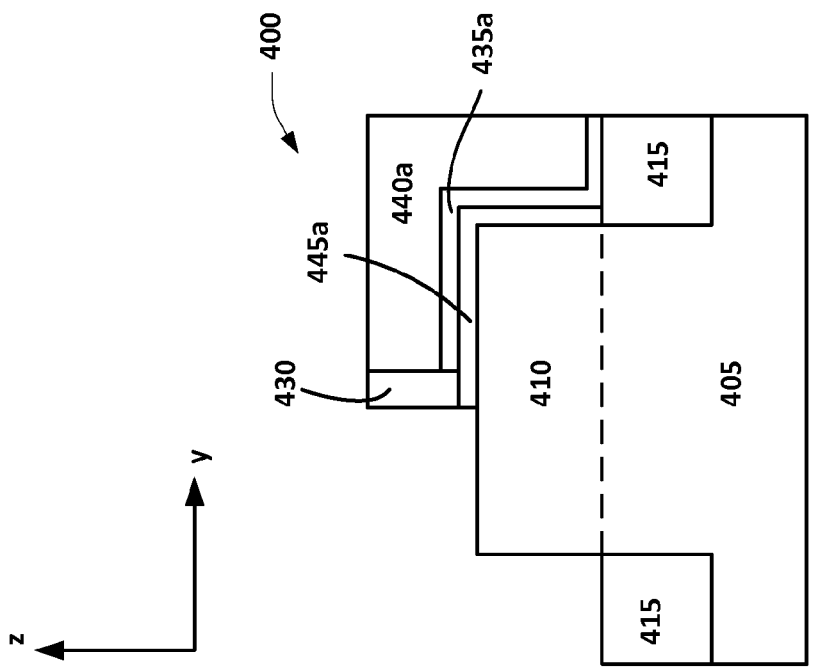
Figure 4C:
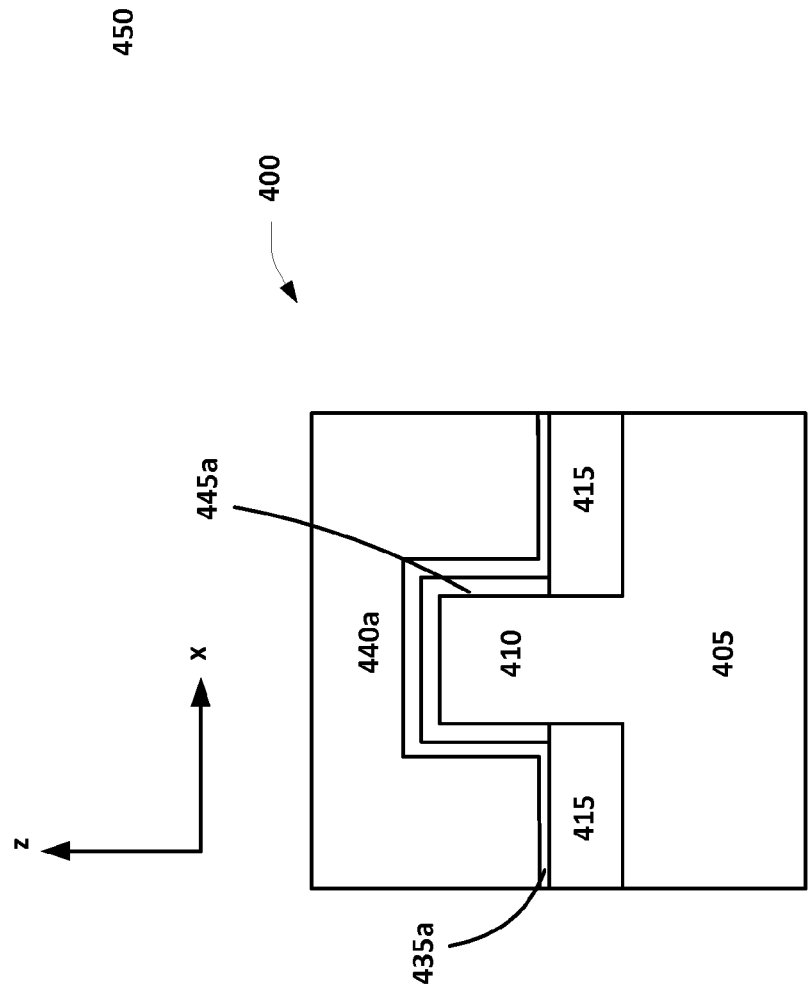
Figure 4D:
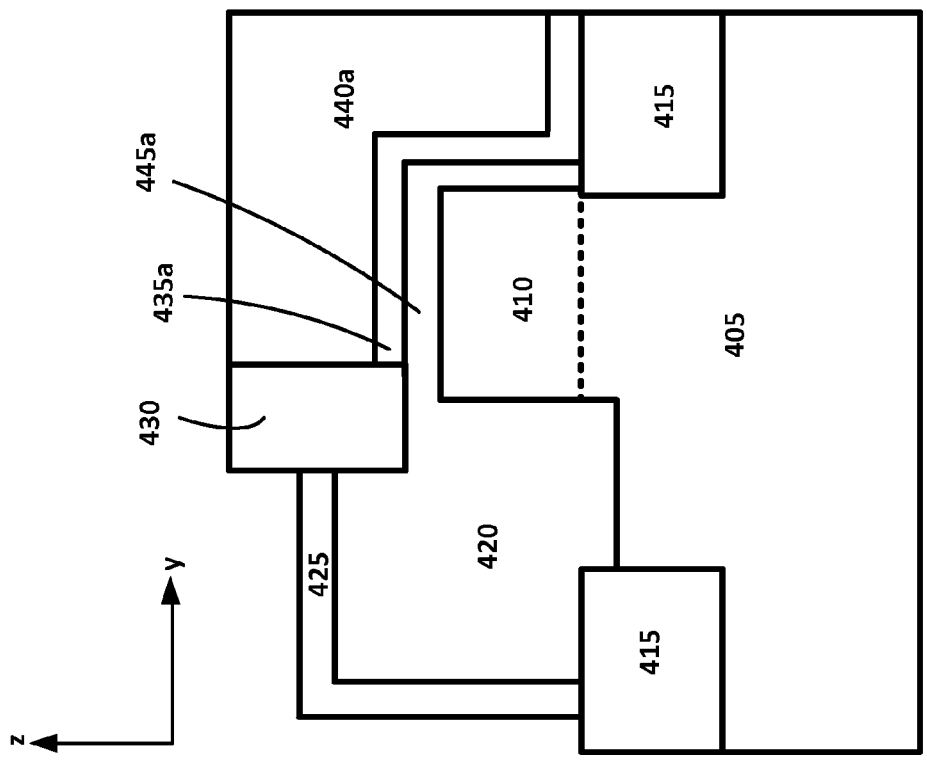
Figure 4D:
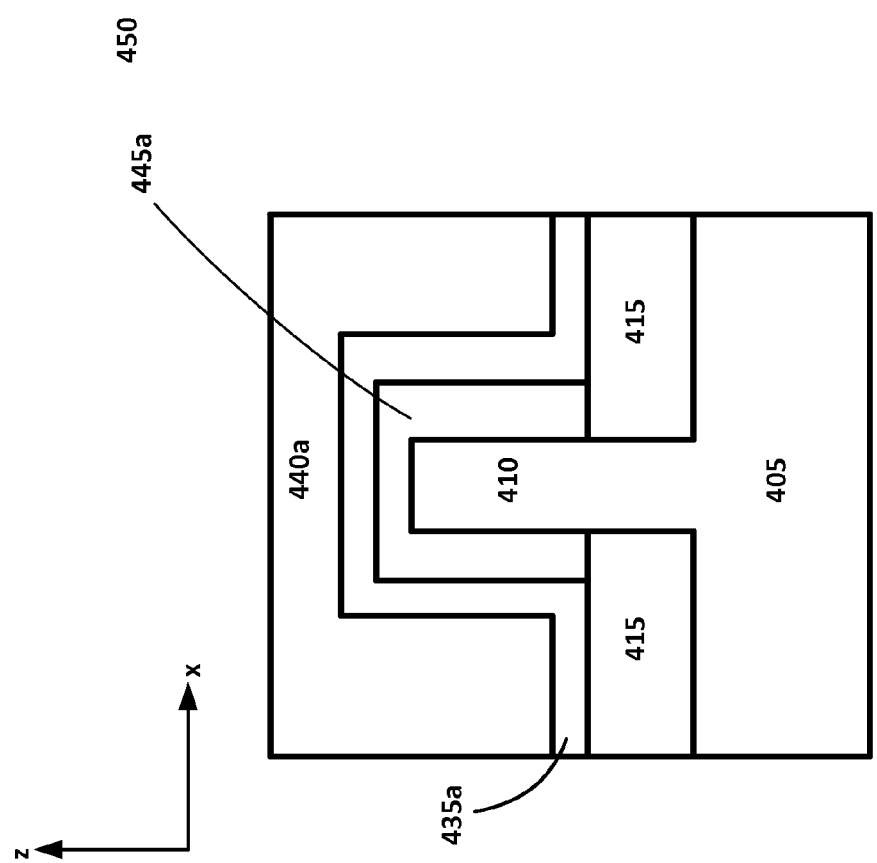
Figure 4E:
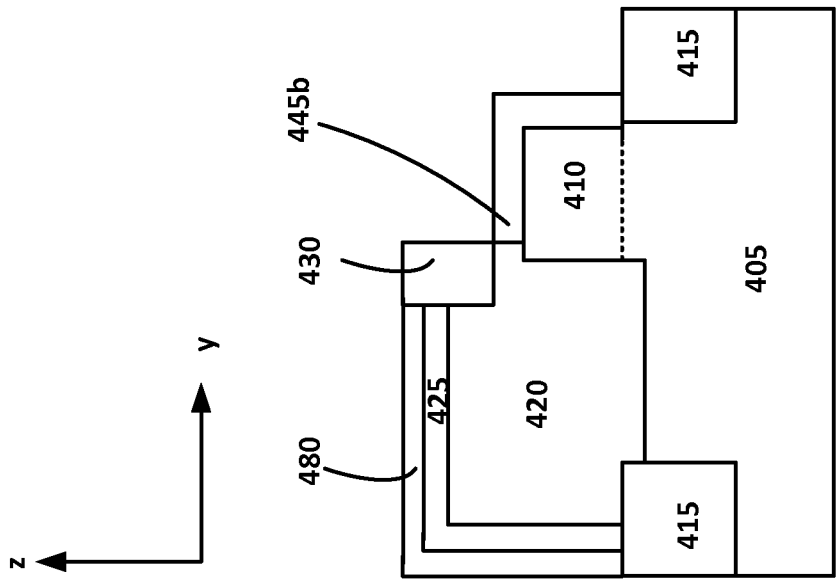
Figure 4E:
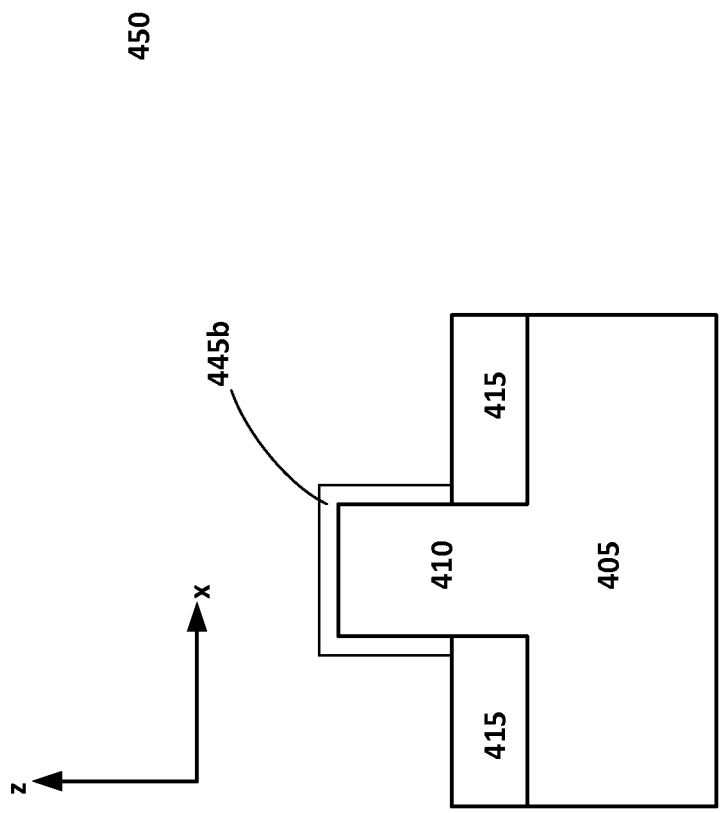
Figure 4F:
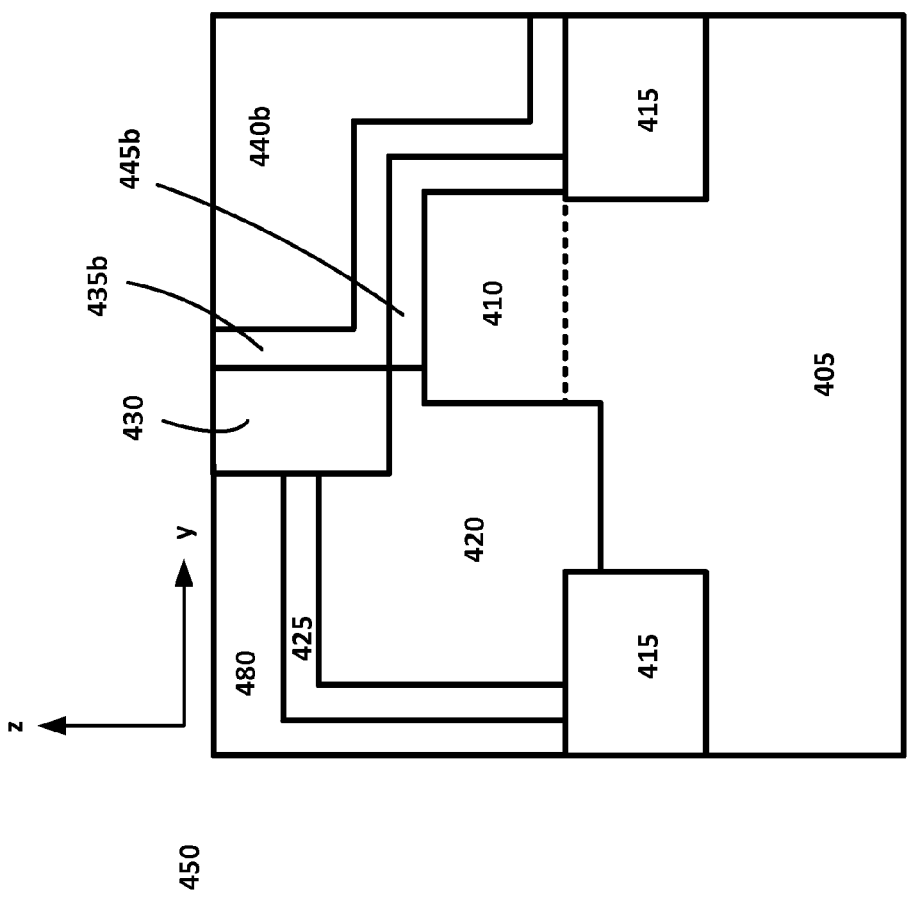
Figure 4F:
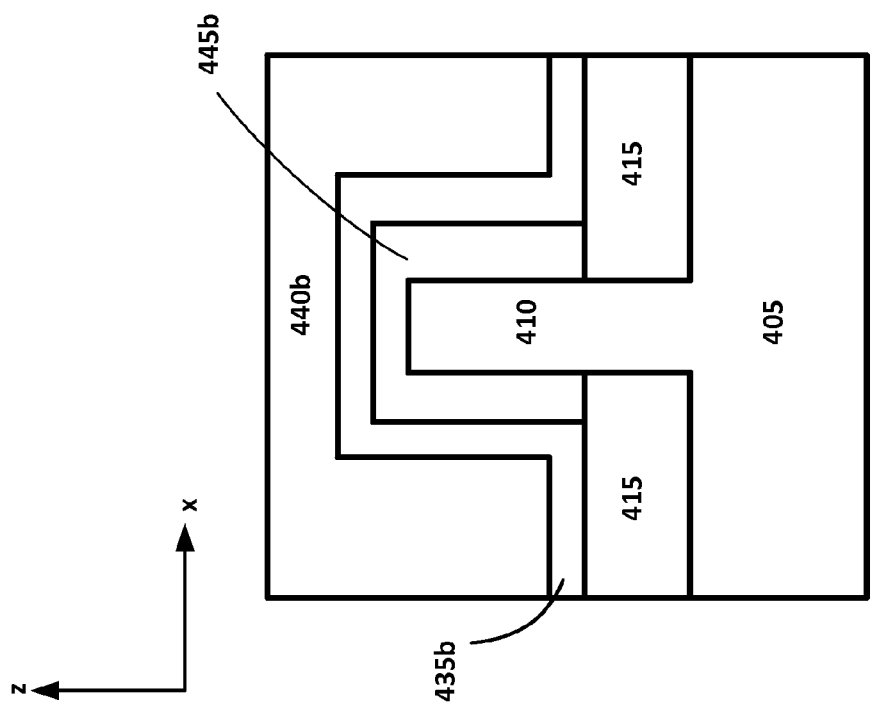

Each of FIGS. 2a-2f shows a cross-sectional view of a different embodiment of a device. FIG. 2a shows a cross-sectional view of a device 200a along the y-z plane. FIG. 2b shows a cross-sectional view of a device 200b along the y-z plane. FIG. 2c shows a cross-sectional view of a device 200c along the y-z plane. FIG. 2d shows a cross-sectional view of a device 200d along the y-z plane. FIG. 2e shows a cross-sectional view of a device 200e along the y-z plane. FIG. 2f shows a cross-sectional view of a device 200f along the y-z plane. Each of the devices 200a-200f differs from the device 100 in one or more aspects. In the interest of brevity, the description of devices 200a-200f below primarily focuses on the difference(s) between each of the devices 200a-200f and device 100.

As shown in FIG. 2a, the device 200a includes a substrate 205a and a transistor structure disposed on the substrate 205a. The transistor includes a fin structure 210a protruding from a surface of the substrate 205a. The transistor has a gate layer 240a conformally disposed over and around a first end of the fin structure 210a along a longitudinal axis of the fin structure 210a to serve as a gate of the transistor. The transistor also has a drain layer 225a disposed over the fin structure 210a and adjacent to the gate layer 240a to serve as a drain of the transistor.

The fin structure 210a is entirely or partially doped with dopants of the first polarity. The fin structure 210a partially serves as a source of the transistor. The fin structure 210a includes a first portion 210a1 and a second portion 210a2. Different from the fin structure 110 of the device 100, the first portion 210a1 of the fin structure 210a is under and surrounded by the gate layer 240a to serve as the source of the transistor, not the second portion 210a2. The second portion 210a2 of the fin structure 210a may be intrinsically-doped or lightly doped with dopants of the first polarity. The drain layer 225a is doped with dopants of the second polarity. In one embodiment, dopants of the first polarity are p-dopants and dopants of the second polarity are n-dopants. Alternatively, dopants of the first polarity are n-dopants and dopants of the second polarity are p-dopants.

The device 200a may include a fin buffer layer 245a disposed on and around the first end of the fin structure 210a. The fin buffer layer 245a, as shown in FIG. 2a, is the same as the fin buffer layer 145 as described in FIGS. 1a-1d. As such, details of the fin buffer layer may not be described. The device 200a may also include a gate dielectric layer 235a disposed between the fin buffer layer 245a and the gate layer 240a. That is, in some embodiments, the fin buffer layer 245a and the gate dielectric layer 235a are disposed between the fin structure 210a and the gate layer 240a. The device 200a may further include an intrinsically-doped layer 220a, disposed between the second portion 210a2 of the fin structure 210a and the drain layer 225a to serve as a drain intrinsic region of the transistor, and a dielectric spacer 230a, disposed between the drain layer 225a and the gate layer 240a. A work function tuning layer (not shown) may also be disposed between the gate dielectric layer and the gate layer. In one embodiment, as shown in FIG. 2a, the intrinsically-doped layer 220a is conformally disposed on and around the second end of the fin structure 210a. The device 200a may further include an isolation layer 215a disposed on the substrate 205a and around the fin structure 210a. The gate dielectric layer 235a is also disposed between the dielectric spacer 230a and the gate layer 240a as well as between the isolation layer 215a and the gate layer 240a. An ILD layer 280a is disposed over the substrate. For example, the ILD layer 280a is disposed over the drain layer 225a. The ILD layer, as shown in FIG. 2a, includes a top surface which is substantially coplanar with a top surface of the gate layer 240a.

As shown in FIG. 2b, the device 200b includes a substrate 205b and a transistor structure disposed on the substrate 205b. The transistor includes a fin structure 210b protruding from a surface of the substrate 205b to serve as a source of the transistor. The transistor has a gate layer 240b conformally disposed over and around a first end of the fin structure 210b along a longitudinal axis of the fin structure 210b to serve as a gate of the transistor. The transistor also has a drain layer 225b disposed over and around a second end of the fin structure 210b opposite the first end, and adjacent to the gate layer 240b, to serve as a drain of the transistor.

The fin structure 210b is entirely or partially doped with dopants of the first polarity. The drain layer 225b is doped with dopants of the second polarity. In one embodiment, dopants of the first polarity are p-dopants and dopants of the second polarity are n-dopants. Alternatively, dopants of the first polarity are n-dopants and dopants of the second polarity are p-dopants.

The device 200b may include a fin buffer layer 245b disposed on and around the first end of the fin structure 210b. The fin buffer layer 245b, as shown in FIG. 2b, is the same as the fin buffer layer 145 as described in FIGS. 1a-1d. As such, details of the fin buffer layer may not be described. The device 200b may also include a gate dielectric layer 235b disposed between the fin buffer layer 245b and the gate layer 240b. That is, in some embodiments, the fin buffer layer 245b and the gate dielectric layer 235b are disposed between the fin structure 210b and the gate layer 240b. The device 200b may further include an intrinsically-doped layer 220b, disposed between the fin structure 210b and the drain layer 225b to serve as a drain intrinsic region of the transistor, and a dielectric spacer 230b, disposed between the drain layer 225b and the gate layer 240b. In one embodiment, as shown in FIG. 2b, the intrinsically-doped layer 220b is conformally disposed on and around the second end of the fin structure 210b. The device 200b may further include an isolation layer 215b disposed on the substrate 205b and around the fin structure 210b. The gate dielectric layer 235b is also disposed between the dielectric spacer 230b and the gate layer 240b as well as between the isolation layer 215b and the gate layer 240b. The device 200b may further include an ILD layer 280b disposed over the substrate. For example, the ILD layer 280b is disposed over the drain layer 225b. The ILD layer, as shown in FIG. 2b, includes a top surface which is substantially coplanar with a top surface of the gate layer 240b.

Different from the fin buffer layer 145 of the device 100, the fin buffer layer 245b does not extend to be between the dielectric spacer 230b and the fin structure 210b. Rather, the intrinsically-doped layer 220b is disposed between the dielectric spacer 230b and the fin structure 210b.

As shown in FIG. 2c, the device 200c includes a substrate 205c and a transistor structure disposed on the substrate 205c. The transistor includes a first fin structure 210c1 and a second fin structure 210c2, both protruding from a surface of the substrate 205c. The first fin structure 210c1 serves as a source of the transistor and the second fin structure 210c2 serves as a source contact of the transistor. The transistor has a gate layer 240c conformally disposed over and around a first end of the first fin structure 210c1 along a longitudinal axis of the fin structure 210c, and between a space between the first fin structure 210c1 and the second fin structure 210c2, to serve as a gate of the transistor. The transistor also has a drain layer 225c disposed over and around a second end of the first fin structure 210c1 opposite the first end, and adjacent to the gate layer 240c, to serve as a drain of the transistor.

The fin structure 210c is entirely or partially doped with dopants of the first polarity. The drain layer 225c is doped with dopants of the second polarity. In one embodiment, dopants of the first polarity are p-dopants and dopants of the second polarity are n-dopants. Alternatively, dopants of the first polarity are n-dopants and dopants of the second polarity are p-dopants.

The device 200c may include a fin buffer layer 245c disposed on and around the first end of the fin structure 210c. The fin buffer layer 245c, as shown in FIG. 2c, is the same as the fin buffer layer 145 as described in FIGS. 1a-1d. As such, details of the fin buffer layer may not be described. The device 200c may also include a gate dielectric layer 235c disposed between the fin buffer layer 245c and the gate layer 240c. That is, in some embodiments, the fin buffer layer 245c and the gate dielectric layer 235c are disposed between the fin structure 210c and the gate layer 240c. The device 200c may further include an intrinsically-doped layer 220c, disposed between the fin structure 210c and the drain layer 225c to serve as a drain intrinsic region of the transistor, and a dielectric spacer 230c, disposed between the drain layer 225c and the gate layer 240c. In one embodiment, as shown in FIG. 2c, the intrinsically-doped layer 220c is conformally disposed on and around the second end of the fin structure 210c. The device 200c may further include an isolation layer 215c disposed on the substrate 205c and around the fin structure 210c. The gate dielectric layer 235c is also disposed between the dielectric spacer 230c and the gate layer 240c as well as between the isolation layer 215c and the gate layer 240c. The device 200c may further include an ILD layer 280c disposed over the substrate. For example, the ILD layer 280c is disposed over the drain layer 225c and the second fin structure 210c2. The ILD layer, as shown in FIG. 2c, includes a top surface which is substantially coplanar with a top surface of the gate layer 240c.

As shown in FIG. 2c, besides the gate layer 240c, the fin buffer layer 245c, the dielectric spacer 230c and the gate dielectric layer 235c are also disposed in the space between the first fin structure 210c1 and the second fin structure 210c2.

In an alternate embodiment (not shown), the isolation layer 215c may be wider than that shown in FIG. 2c and the gate layer 240c could land totally within the isolation layer 215c. In this case, a gap may be present between the gate and the second fin structure. The second fin structure, thus, may not be adjacent and contacting the gate.

As shown in FIG. 2d, the device 200d includes a substrate 205d and a transistor structure disposed on the substrate 205d. The transistor includes a fin structure 210d protruding from a surface of the substrate 205d to serve as a source of the transistor. The transistor has a gate layer 240d conformally disposed over and around a first end of the fin structure 210d along a longitudinal axis of the fin structure 210d to serve as a gate of the transistor. The transistor also has a drain layer 225d disposed over and around a second end of the fin structure 210d opposite the first end, and adjacent to the gate layer 240d, to serve as a drain of the transistor.

The fin structure 210d is entirely or partially doped with dopants of the first polarity. The drain layer 225d is doped with dopants of the second polarity. In one embodiment, dopants of the first polarity are p-dopants and dopants of the second polarity are n-dopants. Alternatively, dopants of the first polarity are n-dopants and dopants of the second polarity are p-dopants.

The device 200d may include a fin buffer layer 245d disposed on and around the first end of the fin structure 210d. The fin buffer layer 245d, as shown in FIG. 2d, is the same as the fin buffer layer 145 as described in FIGS. 1a-1d. As such, details of the fin buffer layer may not be described. The device 200d may also include a gate dielectric layer 235d disposed between the fin buffer layer 245d and the gate layer 240d. That is, in some embodiments, the fin buffer layer 245d and the gate dielectric layer 235d are disposed between the fin structure 210d and the gate layer 240d. The device 200d may further include an intrinsically-doped layer 220d, disposed between the fin structure 210d and the drain layer 225d to serve as a drain intrinsic region of the transistor, and a dielectric spacer 230d, disposed between the drain layer 225d and the gate layer 240d. In one embodiment, as shown in FIG. 2d, the intrinsically-doped layer 220d is conformally disposed on and around the second end of the fin structure 210d. The device 200d may further include an isolation layer 215d disposed on the substrate 205d and around the fin structure 210d. The gate dielectric layer 235d is also disposed between the dielectric spacer 230d and the gate layer 240d as well as between the isolation layer 215d and the gate layer 240d. The device 200d may further include an ILD layer 280d disposed over the substrate. For example, the ILD layer 280d is disposed over the drain layer 225d. The ILD layer, as shown in FIG. 2d, includes a top surface which is substantially coplanar with a top surface of the gate layer 240d.

Different from the fin structure 110 of the device 100 and the fin structure 210b of the device 200b, the fin structure 210d is partially recessed to increase the number of surfaces as well as surface area of the fin structure 210d for tunneling. As shown in FIG. 2d, five surfaces of the fin structure 210d are completely or partially adjacent to the gate layer 240c to function as tunneling surfaces.

As shown in FIG. 2e, the device 200e includes a substrate 205e and a transistor structure disposed on the substrate 205e. The transistor includes a fin structure 210e protruding from a surface of the substrate 205e to serve as a source of the transistor. The transistor has a gate layer 240e conformally disposed over and around a first end of the fin structure 210e along a longitudinal axis of the fin structure 210e to serve as a gate of the transistor. The transistor also has a drain layer 225e disposed adjacent to a second end of the fin structure 210e opposite the first end, and adjacent to the gate layer 240e, to serve as a drain of the transistor.

The fin structure 210e is entirely or partially doped with dopants of the first polarity. The drain layer 225e is doped with dopants of the second polarity. In one embodiment, dopants of the first polarity are p-dopants and dopants of the second polarity are n-dopants. Alternatively, dopants of the first polarity are n-dopants and dopants of the second polarity are p-dopants.

The device 200e may include a fin buffer layer 245e disposed on and around the first end of the fin structure 210e. The fin buffer layer 245e, as shown in FIG. 2e, is the same as the fin buffer layer 145 as described in FIGS. 1a-1d. As such, details of the fin buffer layer may not be described. The device 200e may also include a gate dielectric layer 235e disposed between the fin buffer layer 245e and the gate layer 240e. That is, in some embodiments, the fin buffer layer 245e and the gate dielectric layer 235e are disposed between the fin structure 210e and the gate layer 240e. The device 200e may further include an intrinsically-doped layer 220e, disposed between the fin structure 210e and the drain layer 225e to serve as a drain intrinsic region of the transistor, and a dielectric spacer 230e, disposed between the drain layer 225e and the gate layer 240e. In one embodiment, as shown in FIG. 2e, the intrinsically-doped layer 220e is conformally disposed on and around the second end of the fin structure 210e. The device 200e may further include an isolation layer 215e disposed on the substrate 205e and around the fin structure 210e. The gate dielectric layer 235e is also disposed between the dielectric spacer 230e and the gate layer 240e as well as between the isolation layer 215e and the gate layer 240e. The device 200e may further include an ILD layer 280e disposed over the substrate. For example, the ILD layer 280e is disposed over the drain layer 225e. The ILD layer, as shown in FIG. 2e, includes a top surface which is substantially coplanar with a top surface of the gate layer 240e.

Different from the fin buffer layer 145 of the device 100 and similar with the fin buffer layer 245b, the fin buffer layer 245e does not extend to be between the dielectric spacer 230e and the fin structure 210e. Rather, the intrinsically-doped layer 220e is disposed between the dielectric spacer 230e and the fin structure 210e. Also, as shown in FIG. 2e, the fin structure 210e may be shorter in length than the fin structure 110 of the device 100 in that no part of the fin structure 210e is directly under the drain layer 225e and most of the fin structure 210e is directly under the gate layer 240e.

As shown in FIG. 2f, the device 200f includes a substrate 205f and a transistor structure disposed on the substrate 205f. The fin structure 210f serves as a source of the transistor. The transistor has a gate layer 240f conformally disposed over and around a first end of the fin structure 210f along a longitudinal axis of the fin structure 210f to serve as a gate of the transistor. The transistor also has a drain layer 225f disposed over the fin structure 210f, and adjacent to the gate layer 240f, to serve as a drain of the transistor.

The fin structure 210f is entirely or partially doped with dopants of the first polarity. The drain layer 225f is doped with dopants of the second polarity. In one embodiment, dopants of the first polarity are p-dopants and dopants of the second polarity are n-dopants. Alternatively, dopants of the first polarity are n-dopants and dopants of the second polarity are p-dopants.

The device 200f may include a fin buffer layer 245f disposed on and around the first end of the fin structure 210f. The fin buffer layer 245f, as shown in FIG. 2f, is the same as the fin buffer layer 145 as described in FIGS. 1a-1d. As such, details of the fin buffer layer may not be described. The device 200f may also include a gate dielectric layer 235f disposed between the fin buffer layer 245f and the gate layer 240f. That is, in some embodiments, the fin buffer layer 245f and the gate dielectric layer 235f are disposed between the fin structure 210f and the gate layer 240f. The device 200f may further include an intrinsically-doped layer 220f, disposed between the fin structure 210f and the drain layer 225f to serve as a drain intrinsic region of the transistor, and a dielectric spacer 230f, disposed between the drain layer 225f and the gate layer 240f. In one embodiment, as shown in FIG. 2f, the intrinsically-doped layer 220f is disposed on the fin structure 210f. The device 200f may further include an isolation layer 215f disposed on the substrate 205f and around the fin structure 210f. The gate dielectric layer 235f is also disposed between the dielectric spacer 230f and the gate layer 240f as well as between the isolation layer 215f and the gate layer 240f. The device 200f may further include an ILD layer 280f disposed over the substrate. For example, the ILD layer 280f is disposed over the drain layer 225f. The ILD layer, as shown in FIG. 2f, includes a top surface which is substantially coplanar with a top surface of the gate layer 240f.

Different from the drain layer 125 and the intrinsically-doped layer 120 of the device 100, the drain layer 225f and the intrinsically-doped layer 220f of the device 200f are disposed over a portion (e.g., a central portion) of the fin structure 210f such that a second end of the fin structure 210f opposite the first end of the fin structure 210f is exposed. The exposed portion of the fin structure 210f, for example, allows contacts (not shown) to land on the source which enables a more compact structure to be formed, relative to, for example, device 200c. The drain 225f, for example, may also have a contact (not shown) to connect to upper metal layers.

FIGS. 3a-3f show an embodiment of a process 350 of manufacturing a device 300 having a fin-type transistor. Figures with a subscript (1) are cross-sectional views of the device 300 along the x-z plane while those with a subscript (2) are corresponding cross-sectional views of the device 300 along the y-z plane. The device 300 formed is similar to the device 100 described in FIGS. 1a-1d. As such, in the interest of brevity, common elements may not be described or described in detail.

FIGS. $3a_{(1)}$-$3a_{(2)}$ depict well and source formation and fin formation with isolation. Specifically, a substrate 305 is prepared, a fin structure 310 is formed on the substrate 305 to protrude from the substrate 305 to serve as a source of the transistor, and an isolation layer 315 is formed on the substrate 305 and around the fin structure 310.

The substrate 305 serves as a base for the device 300. In some embodiments, the substrate 305 may be a bulk semiconductor substrate. The bulk substrate may be a silicon substrate. Other types of semiconductor substrates may useful. The substrate 305 may be an undoped or intrinsically-doped substrate. Alternatively, the substrate 305 may be a lightly doped substrate. In one embodiment, the substrate 305 is lightly doped with p-type dopants. In other embodiments, the substrate 305 may be lightly doped with other types of dopants, such as n-type dopants. The fin structure 310 is doped with dopants of a first polarity.

Forming the fin structure 310 may be achieved using various methods. In one embodiment, ion implantation processes are performed on portions of the substrate to define the well and source region. For example, first polarity type dopants are implanted on portion of the substrate using an implant mask to define the source region. Then, the substrate is patterned. For example, a patterned hard mask may be formed over the substrate covering the source region. In one embodiment, a hard mask layer, such as silicon oxide or silicon nitride, is formed on the substrate 305. Other suitable types of materials may also be used as the hard mask layer. The hard mask layer may be formed by chemical vapor deposition (CVD). Other types of hard mask or techniques for forming the hard mask may also be useful.

The hard mask layer is patterned to correspond to the shape of the fin structure 310. The patterning of the hard mask layer can be achieved by mask and etch techniques. For example, a patterned soft mask (not shown), such as photoresist, may be used as an etch mask to pattern the hard mask layer. The soft mask may be patterned by photolithography. To improve lithographic resolution, an ARC (not shown) can be provided beneath the photoresist. The pattern of the photoresist mask is transferred to the hard mask by, for example, an anisotropic etch, such as a reactive ion etch (RIE). An anisotropic etch, such as a RIE, is performed to remove portions of the surface substrate layer unprotected by the hard mask, leaving a fin structure as described above disposed on the top surface of the substrate 305. Alternatively, the fin structure may be formed by forming a blanket epitaxial layer over the substrate. The process continues to form the hard mask as described over the epitaxial layer and performing the patterning and etching process to form a shape corresponding to the fin structure and removing portions of the substrate adjacent to the fin structure.

The process continues to form the isolation layer. An isolation layer, such as an oxide layer, is formed over the substrate covering the fin structure. In one embodiment, a polishing process, such as a chemical mechanical polishing process (CMP) is performed to planarize the oxide material to the top surface of the hard mask layer over the fin structure. A selective etching process, such as selective to the oxide material, is performed to remove or recess portions of the oxide to form the isolation layer 315 as shown in FIGS. $3a_{(1)}$-$3b_{(2)}$. The hard mask layer over the fin structure may then be removed using any suitable types of technique.

FIGS. $3b_{(1)}$-$3b_{(2)}$ depict epitaxial growth of a fin buffer layer. Specifically, a fin buffer layer 345 is conformally formed on and around the fin structure 310. The fin buffer layer may include various material(s) that are configured to provide narrow Eg or Ec which is close to Ev of the source which optimize the tunneling, such as smaller band gap materials. In one embodiment, the fin buffer layer 345 is a band gap engineered layer with pockets of intrinsic dopants and/or dopants of a second polarity opposite the first polarity. The fin buffer layer may include a single layer or multiple layers. For example, the fin buffer layer may be an intrinsic layer or n+ doped layer. Alternatively, the fin buffer layer may include a first intrinsic layer and a second n+ doped layer disposed thereover. The fin buffer layer, in another embodiment, may be a first p+ doped layer and a second intrinsic layer, or a first p+ doped layer with a second n+ doped layer thereover.

FIGS. $3c_{(1)}$-$3c_{(2)}$ depict dummy gate and spacer formation. Specifically, a first gate dielectric layer 335a and a dummy gate layer 340a are formed over the substrate, covering the fin buffer layer 345 and the isolation layer 315. The dummy gate layer 340a is deposited on the gate dielectric layer 335a using any suitable techniques. The dummy gate layer 340a and the first gate dielectric layer 335a are patterned by lithography and etch process to form an intermediate gate structure as shown in FIG. $3c_{(2)}$. The process continues to deposit a spacer layer using suitable techniques over the substrate and the intermediate gate structure and is etched to form a dielectric spacer 330 on the fin buffer layer 345 to be adjacent to the dummy gate layer 340a and the first gate dielectric layer 335a as shown in FIG. $3c_{(2)}$. Referring to FIG. $3c_{(2)}$, portions of the fin buffer layer are removed by an etch process, such that the second end of the fin structure and a portion of the top of the fin structure adjacent to the second end are exposed.

FIGS. $3d_{(1)}$-$3d_{(2)}$ depict a recessed drain process (optional) and epitaxial growth of a drain and an intrinsic region. Specifically, an intrinsically-doped layer 320 is conformally formed on and around a second end of the fin structure 310 opposite the first end of the fin structure 310 to serve as a drain intrinsic region of the transistor. Additionally, a drain layer 325 is formed on the intrinsically-doped layer 320 to be adjacent to the dummy gate layer 340a to serve as a drain of the transistor. The drain layer 325 is formed over the fin structure 310 and around a second end of the fin structure 310 opposite the first end of the fin structure 310. The drain layer 325 is doped with dopants of a second polarity opposite the first polarity.

FIGS. $3e_{(1)}$-$3e_{(2)}$ depict silicidation (optional), inter-level dielectric (ILD) 380 deposition and a planarization process, such as chemical-mechanical polishing (CMP). The ILD includes a top surface which is substantially coplanar with a top surface of the dummy gate layer after the CMP process. The process continues to remove the dummy gate layer 340a and the first gate dielectric layer 335a, exposing portions of the fin buffer layer 345 and the isolation layer 315 adjacent to the first end of the fin structure.

FIGS. $3f_{(1)}$-$3f_{(2)}$ depict metal gate formation. Specifically, a second gate dielectric layer 335b is formed adjacent to the dielectric spacer 330 and on the fin buffer layer 345 as well as on the ILD layer 380. Then, a gate layer 340b is formed on the second gate dielectric layer 335b. A work function tuning layer (not shown) may optionally be formed in between the gate dielectric 335b and the gate layer 340b. A planarization process, such as CMP, is performed to remove portions of the gate layer 340b and the second gate dielectric layer 335b such that the top surface of the ILD 380 is substantially coplanar with top surfaces of the second gate dielectric layer 335b and the gate layer 340b. The gate layer 340b is formed adjacent to four surfaces of the fin structure 310 which serve as tunneling surfaces.

Additional process may be performed to complete the device. For example, the process 350 may include a silicidation process, for example, for the source/drain during contact hole opening, in addition to conventional back end of line process to finish the manufacturing of the device 300. Further, interconnect metal levels may be provided to form interconnections to the terminals of the transistor and other circuit components, as desired. Other processes may include, for example, final passivation, dicing and packaging. It is also understood that the process steps as described above may be modified accordingly to produce a desired device, such as the device shown in FIG. 2a, FIG. 2c or FIG. 2f.

FIGS. 4a-4f show another embodiment of a process 450 of manufacturing a device 400 having a fin-type transistor. Figures with a subscript (1) are cross-sectional views of the device 400 along the x-z plane while those with a subscript (2) are corresponding cross-sectional views of the device 400 along the y-z plane. The device 400 formed is similar to the device 200e described in FIG. 2e. As such, in the interest of brevity, common elements may not be described or described in detail.

FIGS. $4a_{(1)}$-$4a_{(2)}$ depict well and source formation and fin formation with isolation. Specifically, a substrate 405 is prepared, a fin structure 410 is formed on the substrate 405 to protrude from the substrate 405 to serve as a source of the transistor, and an inter-level dielectric layer 415 is formed on the substrate 405 and around the fin structure 410.

The substrate 405 serves as a base for the device 400. In some embodiments, the substrate 405 may be a bulk semiconductor substrate. The bulk substrate may be a silicon substrate. Other types of semiconductor substrates may useful. The substrate 405 may be an undoped or intrinsically-doped substrate. Alternatively, the substrate 405 may be a lightly doped substrate. In one embodiment, the substrate 405 is lightly doped with p-type dopants. In other embodiments, the substrate 405 may be lightly doped with other types of dopants, such as n-type dopants. The fin structure 410 is doped with dopants of a first polarity. The well, source and fin formation with isolation are the same as that already described in FIGS. $3a_{(1)}$-$3a_{(2)}$. Other suitable techniques may also be used to form the well, source and fin structure 410 with the isolation layer.

FIGS. $4b_{(1)}$-$4b_{(2)}$ depict epitaxial growth of a fin buffer layer, which may be optional. Specifically, a first fin buffer layer 445a is conformally formed on and around the fin structure 410. In one embodiment, the first fin buffer layer 445a may be an intrinsic layer or n-type pocket layer. Alternatively, the first fin buffer layer 445a may include an intrinsic layer with n-type pocket layer.

FIGS. $4c_{(1)}$-$4c_{(2)}$ depict dummy gate and spacer formation. Specifically, a first gate dielectric layer 435a and a dummy gate layer 440a are formed over the substrate, covering the first fin buffer layer 445a and the isolation layer 415. The dummy gate layer 440a is deposited on the gate dielectric layer 435a using any suitable techniques. The dummy gate layer 440a and the first gate dielectric layer 435a are patterned by lithography and etch process to form an intermediate gate structure as shown in FIG. $4c_{(2)}$. The process continues to deposit a spacer layer using suitable techniques over the substrate and the intermediate gate structure and is etched to form a dielectric spacer 430 on the first fin buffer layer 445a to be adjacent to the dummy gate layer 440a and the first gate dielectric layer 435a as shown in FIG. $4c_{(2)}$. Referring to FIG. $4c_{(2)}$, portions of the fin buffer layer are removed by an etch process, such that the second end of the fin structure and a portion of the top of the fin structure adjacent to the second end are exposed.

FIGS. $4d_{(1)}$-$4d_{(2)}$ depict a recessed drain process (optional) and epitaxial growth of a drain and an intrinsic region. Specifically, a portion of the fin structure 410 that is not directly under and surrounded by the dummy gate layer 440a is removed, e.g., etched, so that the fin structure 410 is shortened in length along the longitudinal axis of the fin structure 410. Optionally, a recess is formed on the substrate 405. Then, an intrinsically-doped layer 420 is conformally formed on the substrate 405 and isolation layer 415, and adjacent to a second end of the fin structure 410 opposite the first end of the fin structure 410, to serve as a drain intrinsic region of the transistor. Additionally, a drain layer 425 is formed on the intrinsically-doped layer 420 to be adjacent to the dummy gate layer 440a to serve as a drain of the transistor. The drain layer 425 is doped with dopants of a second polarity opposite the first polarity.

FIGS. $4e_{(1)}$-$4e_{(2)}$ depict silicidation (optional), inter-level dielectric (ILD) deposition 480, and a planarization process, such as chemical-mechanical polishing (CMP). The ILD 480 includes a top surface which is substantially coplanar with a top surface of the dummy gate layer after the CMP process. The process continues to remove the dummy gate layer 440a and the first gate dielectric layer 435a, exposing portions of the first fin buffer layer 445a and the isolation layer 415 adjacent to the first end of the fin structure. The first fin buffer layer 445a, which may be an intrinsically-doped layer, is also removed. Optionally, a second fin buffer layer 445b is formed on the fin structure 410. The second fin buffer layer 445b, for example, is the same as the fin buffer layer 345 as described in FIGS. $3b_{(1)}$-$3b_{(2)}$.

FIGS. $4f_{(1)}$-$4f_{(2)}$ depict metal gate formation. Specifically, a second gate dielectric layer 435b is formed adjacent to the dielectric spacer 430 and on the second fin buffer layer 445b as well as on the inter-level dielectric layer 480. Then, a gate layer 440b is formed on the second gate dielectric layer 435b. A work function tuning layer (not shown) may optionally be formed in between the second gate dielectric 435b and the gate layer 440b. A planarization process, such as CMP, is performed to remove portions of the gate layer 440b and the second gate dielectric layer 435b such that the top surface of the ILD 480 is substantially coplanar with top surfaces of the second gate dielectric layer 435b and the gate layer 440b. The second gate layer 440b is formed adjacent to four surfaces of the fin structure 410 which serve as tunneling surfaces.

Additional processes may be performed to complete the device. For example, the process 450 may include a silicidation process, for example, for the source/drain during contact hole opening, in addition to conventional back end of line process to finish the manufacturing of the device 400. Further, interconnect metal levels may be provided to form interconnections to the terminals of the transistor and other circuit components, as desired. Other processes may include, for example, final passivation, dicing and packaging. It is also understood that the process steps as described above may be modified accordingly to produce a desired device, such as the device shown in FIG. 2b or FIG. 2d.

The embodiments as described with respect to FIGS. 3a-3f and FIGS. 4a-4f include some or all advantages as described with respect to FIGS. 1a-1d and FIGS. 2a-2f. As such, these advantages will not be described or described in detail.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate; and
   a fin-type transistor disposed on the substrate, wherein the transistor comprises
      a fin structure protruding from the substrate to serve as a source of the transistor, the fin structure doped with dopants of a first polarity,
      a gate layer disposed over and around a first end of the fin structure to serve as a gate of the transistor, and
      a drain layer disposed over the fin structure and adjacent to the gate layer to serve as a drain of the transistor, the drain layer doped with dopants of a second polarity opposite the first polarity.

2. The device of claim 1, wherein four surfaces of the fin structure which are at least partially adjacent to the gate layer serve as tunneling surfaces.

3. The device of claim 1, wherein the transistor further comprises:
   a fin buffer layer disposed on and around the first end of the fin structure.

4. The device of claim 3, wherein the fin buffer layer comprises a band gap engineered layer.

5. The device of claim 3, wherein the transistor further comprises:
   a gate dielectric layer disposed over the fin buffer layer; and
   a work function tuning layer disposed between the gate dielectric layer and the gate layer.

6. The device of claim 1, wherein the transistor further comprises:

an intrinsically-doped layer disposed between the fin structure and the drain layer to serve as an intrinsic region of the transistor; and a dielectric spacer disposed between the drain layer and the gate layer.

7. A method of manufacturing a device, comprising:

forming a fin-type transistor on a substrate, wherein forming the transistor comprises:

forming a fin structure that protrudes from the substrate to serve as a source of the transistor, the fin structure doped with dopants of a first polarity;

forming a gate layer over and around a first end of the fin structure to serve as a gate of the transistor; and forming a drain layer over the fin structure and adjacent to the gate layer to serve as a drain of the transistor, the drain layer doped with dopants of a second polarity opposite the first polarity.

8. The method of claim 7, wherein forming the gate layer over and around the first end of the fin structure comprises forming the gate layer adjacent to four surfaces of the fin structure which serve as tunneling surfaces.

9. The method of claim 7, wherein forming the drain layer over the fin structure comprises forming the drain layer over the fin structure and around a second end of the fin structure opposite the first end of the fin structure.

10. The method of claim 7, wherein forming the fin structure further comprises:

forming an inter-level dielectric layer on the substrate and around the fin structure.

11. The method of claim 10, further comprising:

prior to forming the gate layer, forming a fin buffer layer on and around the first end of the fin structure.

12. The method of claim 11, wherein the fin buffer layer is a band gap engineered layer with pockets of intrinsic dopants and dopants of the second polarity.

13. The method of claim 11, further comprising:

forming a first gate dielectric layer on the fin buffer layer and the inter-level dielectric layer with a part of the fin buffer layer exposed.

14. The method of claim 13, further comprising:

forming a dummy gate layer on the first gate dielectric layer; and forming a dielectric spacer on the fin buffer layer adjacent to the dummy gate layer and the first gate dielectric layer.

15. The method of claim 14, wherein forming the drain layer comprises:

forming an intrinsically-doped layer on and around a second end of the fin structure opposite the first end of the fin structure to serve as an intrinsic region of the transistor; and forming the drain layer on the intrinsically-doped layer.

16. The method of claim 15, further comprising:

prior to forming the intrinsically-doped layer and the drain layer, removing a second end of the fin structure opposite the first end of the fin structure to form a recess on the substrate.

17. The method of claim 15, further comprising:

performing a silicidation process;

forming an inter-level dielectric layer (ILD) over the substrate; and performing a chemical-mechanical polishing process.

18. The method of claim 15, wherein forming the gate layer comprises:

removing the dummy gate layer;

removing the first gate dielectric layer;

forming a second gate dielectric layer adjacent to the dielectric spacer and on the fin buffer layer and the inter-level dielectric layer; and forming the gate layer on the second gate dielectric layer.

19. The method of claim 18, wherein forming the gate layer further comprises:

removing the fin buffer layer which is an intrinsically-doped layer; and prior to forming the second gate dielectric layer, forming a band gap engineered layer doped with dopants of the first polarity and having pockets of intrinsic dopants and dopants of the second polarity.

20. The method of claim 18, wherein forming the transistor further comprises:

performing a silicidation process for the source or drain region.

* * * * *